(12) United States Patent
Uchida

(10) Patent No.: US 8,691,603 B2
(45) Date of Patent: Apr. 8, 2014

(54) ORGANIC EL DEVICE MANUFACTURING METHOD, ORGANIC EL DEVICE, AND ELECTRONIC APPARATUS HAVING A LUMINESCENT LAYER DISPOSED OVER ANOTHER LUMINESCENT LAYER

(75) Inventor: Masahiro Uchida, Chino (JP)

(73) Assignee: Seiko Epson Corporation, Tokyo (JP)

( * ) Notice: Subject to any disclaimer, the term of this patent is extended or adjusted under 35 U.S.C. 154(b) by 599 days.

(21) Appl. No.: 12/911,957

(22) Filed: Oct. 26, 2010

(65) Prior Publication Data

US 2011/0101398 A1 May 5, 2011

(30) Foreign Application Priority Data

Nov. 3, 2009 (JP) ................................. 2009-252513
May 27, 2010 (JP) ................................. 2010-121325

(51) Int. Cl.
  *H01L 21/00* (2006.01)
(52) U.S. Cl.
  USPC .................. 438/29; 438/28; 438/34; 257/89; 257/98
(58) Field of Classification Search
  USPC ........... 257/59, 72, 40, 79, 80, 81, 82, 88, 89, 257/98, 143, 144, 152, 83, 84, 431, 432, 257/433; 438/29, 128, 34, 28, 22
  See application file for complete search history.

(56) References Cited

U.S. PATENT DOCUMENTS

| | | | |
|---|---|---|---|
| 6,863,961 B2 | 3/2005 | Miyashita et al. | |
| 2007/0046185 A1 | 3/2007 | Kim | |
| 2008/0018239 A1 | 1/2008 | Matsuda et al. | |
| 2008/0124647 A1* | 5/2008 | Matsuda et al. ........... | 430/270.1 |
| 2009/0039778 A1 | 2/2009 | Tomita | |
| 2010/0258833 A1* | 10/2010 | Okumoto et al. ............... | 257/98 |
| 2011/0018007 A1 | 1/2011 | Kasahara et al. | |

FOREIGN PATENT DOCUMENTS

| | | |
|---|---|---|
| JP | A-10-153967 | 6/1998 |
| JP | A-2003-332055 | 11/2003 |
| JP | A-2007-66862 | 3/2007 |
| JP | A-2007-73532 | 3/2007 |
| JP | A-2008-27722 | 2/2008 |
| JP | A-2009-43499 | 2/2009 |
| JP | A-2009-135053 | 6/2009 |

* cited by examiner

*Primary Examiner* — Thanh Y Tran
(74) *Attorney, Agent, or Firm* — Oliff PLC

(57) ABSTRACT

In a method for manufacturing an organic EL device, a first luminescent layer emitting first color light is formed over a first anode disposed on a substrate by coating. A second luminescent layer emitting second color light is formed over a second anode disposed on the substrate. An intermediate layer having electron injection performance is formed on the first luminescent layer and the second luminescent layer. A third luminescent layer emitting third color light is formed over the intermediate layer and a third anode disposed on the substrate by vapor deposition. A cathode is formed on the third luminescent layer.

15 Claims, 16 Drawing Sheets

ORGANIC EL DEVICE MANUFACTURING METHOD, ORGANIC EL DEVICE, AND ELECTRONIC APPARATUS HAVING A LUMINESCENT LAYER DISPOSED OVER ANOTHER LUMINESCENT LAYER

BACKGROUND

1. Technical Field

The present invention relates to a method for manufacturing an organic EL device, and to an organic EL device and an electronic apparatus.

2. Related Art

Organic EL (electroluminescence) devices have a structure having a light-emitting function layer including a luminescent layer between an anode and a cathode. The light-emitting function layer may be a multilayer composite including a hole transport layer, a luminescent layer, and an electron transport layer in that order from the anode side. By applying a voltage between the anode and the cathode, holes and electrons are injected respectively from the electron transport layer and the hole transport layer to the luminescent layer, and light is emitted when the electrons and the holes are recombined to each other.

The organic EL device can be manufactured by a coating method, which allows easy patterning over a large area and efficient use of materials. However, the blue luminescent layer (B) formed by coating has not yet reached such level as can be put to practical use, while the red luminescent layer (R) and the green luminescent layer (G) are at a practical level in light emitting characteristics, such as lifetime. On the other hand, blue luminescent layers (B) formed by vapor deposition are reaching a practical level.

For example, JP-A-2007-73532, JP-A-2003-332055 and JP-A-10-153967 disclose methods in which the red luminescent layer (R) and the green luminescent layer (G) are formed by coating, while the blue luminescent layer (B) is formed over the entire surface overlying the red luminescent layer (R) and the green luminescent layer (G) by vapor deposition.

Unfortunately, charges are not smoothly transferred between macromolecular materials used for coating and low-molecular-weight materials used for vapor deposition. In other words, electrons are not easily injected to the luminescent layer that is to be excited for emitting light. Consequently, the luminous efficiency can be degraded or the lifetime of the luminescent layer can be reduced.

SUMMARY

An advantage of some aspects of the invention is that it provides a method for manufacturing an organic EL device that can overcome the above-described disadvantages, and an organic EL device manufactured by the method and an electronic apparatus.

According to an aspect of the invention, a method is provided for manufacturing an organic EL device. In the method, a first luminescent layer emitting first color light is formed over a first anode disposed on a substrate by coating. A second luminescent layer emitting second color light is formed over a second anode disposed on the substrate. An intermediate layer having electron injection performance is formed on the first luminescent layer and the second luminescent layer. A third luminescent layer emitting third color light is formed over the intermediate layer and a third anode disposed on the substrate by vapor deposition. A cathode is formed on the third luminescent layer.

In this method, the first or the second luminescent layer formed by coating and the third luminescent layer formed by vapor deposition are disposed one on top of the other with the intermediate layer having electron injection performance therebetween. This structure can enhance (ensure) the electron injection performance between the third luminescent layer and the first and second luminescent layers. Accordingly, electrons from the cathode can be smoothly transferred to the first luminescent layer and the second luminescent layer from the third luminescent layer. Consequently, the light-emitting elements can emit light over a long term, and their lifetime can be increased. Thus, the resulting organic EL device can exhibit high luminous efficiency and a long lifetime.

In the above structure, preferably, the first luminescent layer is a red luminescent layer, the second luminescent layer is a green luminescent layer, and the third luminescent layer is a blue luminescent layer.

In the method, the red luminescent layer and the green luminescent layer are formed by coating, while the blue luminescent layer is formed by vapor deposition. Consequently, it becomes possible to bring the blue luminescent characteristics (for example, lifetime) close to the red and green luminescent characteristics. Thus, the resulting organic EL device can display high-quality images.

Preferably, the third luminescent layer includes a layer having hole transport performance and a layer having electron transport performance.

In this instance, the third luminescent layer includes the layer having hole transport performance and the layer having electron transport performance. Accordingly, by providing the third luminescent layer between the third anode and the cathode, transfer of holes and electrons becomes possible, and the third color light can be efficiently emitted.

Preferably, the method further includes forming at least one of a hole injection layer and a hole transport layer between the first anode and the first luminescent layer and between the second anode and the second luminescent layer.

Thus the performance of hole transport from the anode to the luminescent layer can be enhanced.

Preferably, the method further includes forming at least one of a hole injection layer and a hole transport layer between the third anode and the third luminescent layer.

Thus the performance of hole transport from the anode to the luminescent layer can be enhanced.

Preferably, the intermediate layer is formed between the hole injection layer or the hole transport layer and the third luminescent layer.

Preferably, the intermediate layer is formed in a region including a portion between the third anode and the third luminescent layer.

Since the intermediate layer is disposed between the third anode and the third luminescent layer, the performance of electron injection from the cathode can be enhanced.

The intermediate layer may be formed by coating.

Coating allows the intermediate layer to be formed selectively for each luminescent layer. Accordingly, the amount of the material of the intermediate layer can be smaller than that in the case where the intermediate layer is formed over the entire surface of the substrate.

The intermediate layer may be formed by vapor deposition.

Vapor deposition can form the intermediate layer uniformly over the entire surface of the substrate at one time. In addition, the material can be selected from a wide range of materials.

Preferably, the coating is an ink jet method.

Since the ink jet method is applied, the luminescent layers can be formed by ejecting liquid droplets onto the regions of the luminescent layers from one region to another. In other words, a function layer can be formed selectively.

Preferably, the intermediate layer contains cesium carbonate.

Preferably, the method further includes forming a color conversion layer.

In this instance, light is emitted through the color conversion layer (color filter), so that light can be colored or a mixed color can be removed. Hence, light having a desired wavelength can be emitted.

According to another aspect of the invention, an organic EL device is provided which includes a substrate, first luminescent layer emitting first color light formed by coating over a first anode disposed on the substrate, a second luminescent layer emitting second color light formed by coating over a second anode disposed on the substrate, a third luminescent layer emitting third color light formed by vapor deposition over the first luminescent layer and the second luminescent layer and in a region including the portion overlying a third anode disposed on the substrate, a cathode disposed on the third luminescent layer, and an intermediate layer having electron injection performance between the first luminescent layer and the third luminescent layer and between the second luminescent layer and the third luminescent layer.

In this structure, the first or the second luminescent layer formed by coating and the third luminescent layer formed by vapor deposition are layered with the intermediate layer having electron injection performance therebetween. This structure can enhance (ensure) the electron injection performance between the third luminescent layer and the first or second luminescent layer. Accordingly, electrons from the cathode can be smoothly transferred to the first luminescent layer and the second luminescent layer from the third luminescent layer. Consequently, the light-emitting elements can emit light over a long term, and their lifetime can be increased. Thus, the organic EL device can exhibit high luminous efficiency and a long lifetime.

Preferably, the first luminescent layer emits red light, the second luminescent layer emits green light, and the third luminescent layer emits blue light.

In this structure, the red luminescent layer and the green luminescent layer are formed by coating, while the blue luminescent layer is formed by vapor deposition. Consequently, it becomes possible to bring the blue luminescent characteristics (for example, lifetime) close to the red and green luminescent characteristics. Thus, the organic EL device can display high-quality images.

According to still another aspect of the invention, an electronic apparatus is provided which includes an organic EL device produced by the above-described method, or the above-described organic EL device.

The electronic apparatus can display high-quality images.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
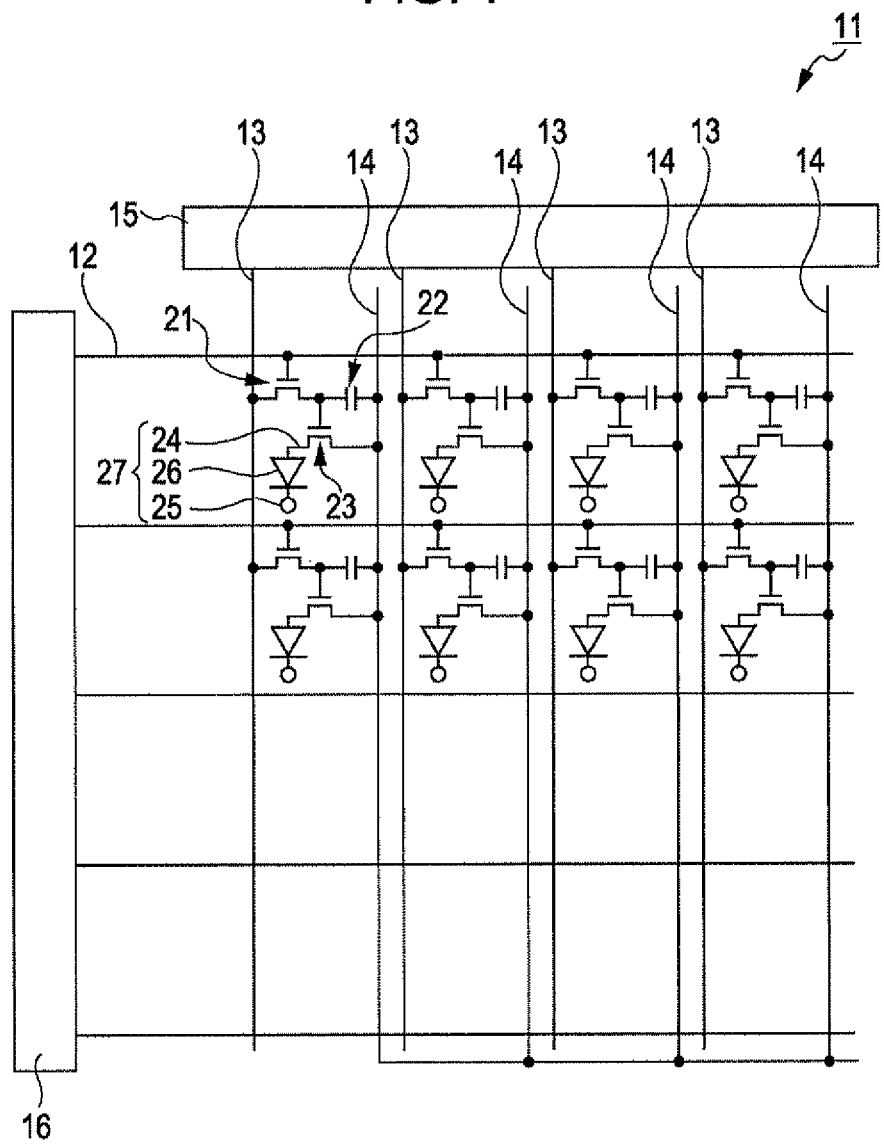
FIG. 1 is an equivalent circuit of the electrical structure of an organic EL device according to a first embodiment of the invention.

Some embodiments of the invention will be described with reference to the drawings. For the sake of visibility, the dimensional proportions of the parts shown in the drawings may differ as needed.

First Embodiment

Structure of Organic EL Device

FIG. 1 is an equivalent circuit of the electrical structure of an organic EL device according to a first embodiment of the invention. The structure of the organic EL device will now be described with reference to FIG. 1. Although the organic EL device according to the first embodiment has a bottom emission structure, the invention can be applied to a top emission structure.

As shown in FIG. 1, the organic EL device 11 includes a plurality of scanning lines 12, a plurality of signal lines 13 extending in the direction intersecting the scanning lines 12, and a plurality of power lines 14 extending parallel to the signal lines 13. These lines are arranged in a grid manner. The regions partitioned by the scanning lines 12 and the signal lines 13 are defined as pixel regions. The signal lines 13 are connected to a signal line driving circuit 15. The scanning lines 12 are connected to a scanning line driving circuit 16.

Each pixel region includes a switching TFT (Thin Film Transistor) 21 having a gate electrode to which a scanning signal is applied through the scanning line 12, a hold capacitor 22 holding a pixel signal applied from the signal line 13 through the switching TFT 2, and a driving TFT 23 (hereinafter referred to as TFT element 23) having a gate electrode to which the pixel signal held in the hold capacitor 22 is applied. The pixel region further includes an anode 24 to which a driving current flows from the power line 14 when being electrically connected to the power line 14 through the TFT element 23, a cathode 25, and a light-emitting function layer 26 acting as a function layer disposed between the anode 24 and the cathode 25.

The organic EL device 11 includes a plurality of light-emitting elements 27, each including the anode 24, the cathode 25 and the light-emitting function layer 26. The organic EL device 11 has a display region defined by the light-emitting elements 27.

In this structure, when the switching TFT 21 comes into an ON state by the operation of the scanning line 12, the potential of the signal line 13 at that time is held in the hold capacitor 22, and the ON/OFF state of the TFT element 23 is determined depending on the state of the hold capacitor 22. Current flows from the power line 14 to the anode 24 through the channel of the TFT element 23, and further flows to the cathode 25 through the light-emitting function layer 26. The light-emitting function layer 26 emits light at a luminance according to the magnitude of the current.

Figure 2:
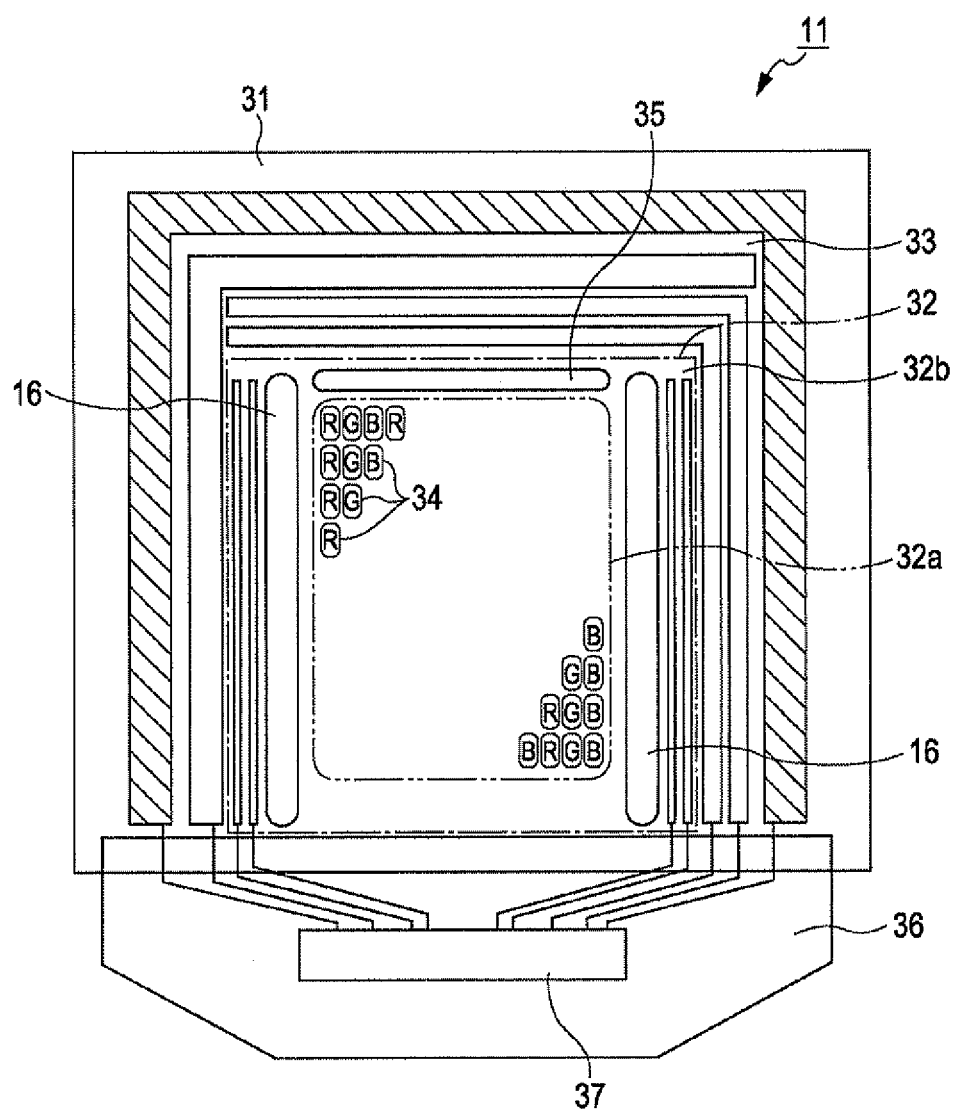
FIG. 2 is a schematic plan view of the organic EL device.

FIG. 2 is a schematic plan view of the organic EL device 11. The structure of the organic EL device 11 will now be described with reference to FIG. 2.

As shown in FIG. 2, the organic EL device 11 has a structure in which a display region 32 (region surrounded by the dotted chain line) and a non-display region 33 (region outside the dotted chain line) in an element substrate 31 made of, for example, glass. The display region 32 includes an effective display region 32a (region surrounded by the two-dot chain line) and a dummy region 32b (region outside the two-dot chain line).

In the effective display region 32a, pixels 34 (light-emitting regions) from which light is emitted are arranged in a matrix manner. Each pixel 34 emits a first color light (for example, red (R) light), a second color light (for example, green (G) light), or a third color light (for example, blue (B) light) according to the operation of the switching TFT 21 and the TFT element 23 (see FIG. 1).

In the dummy region 32b, circuits are disposed which allows mainly the pixels 34 to emit light. For example, scanning line driving circuits 16 are disposed along the right and left sides (in the figure) of the effective display region 32a, and a test circuit 35 is disposed along the upper side (in the figure) of the effective display region 32a.

A flexible substrate 36 is provided along the lower side (in the figure) of the element substrate 31. The flexible substrate 36 includes a driving IC 37 connected with conductor lines.

Figure 3:
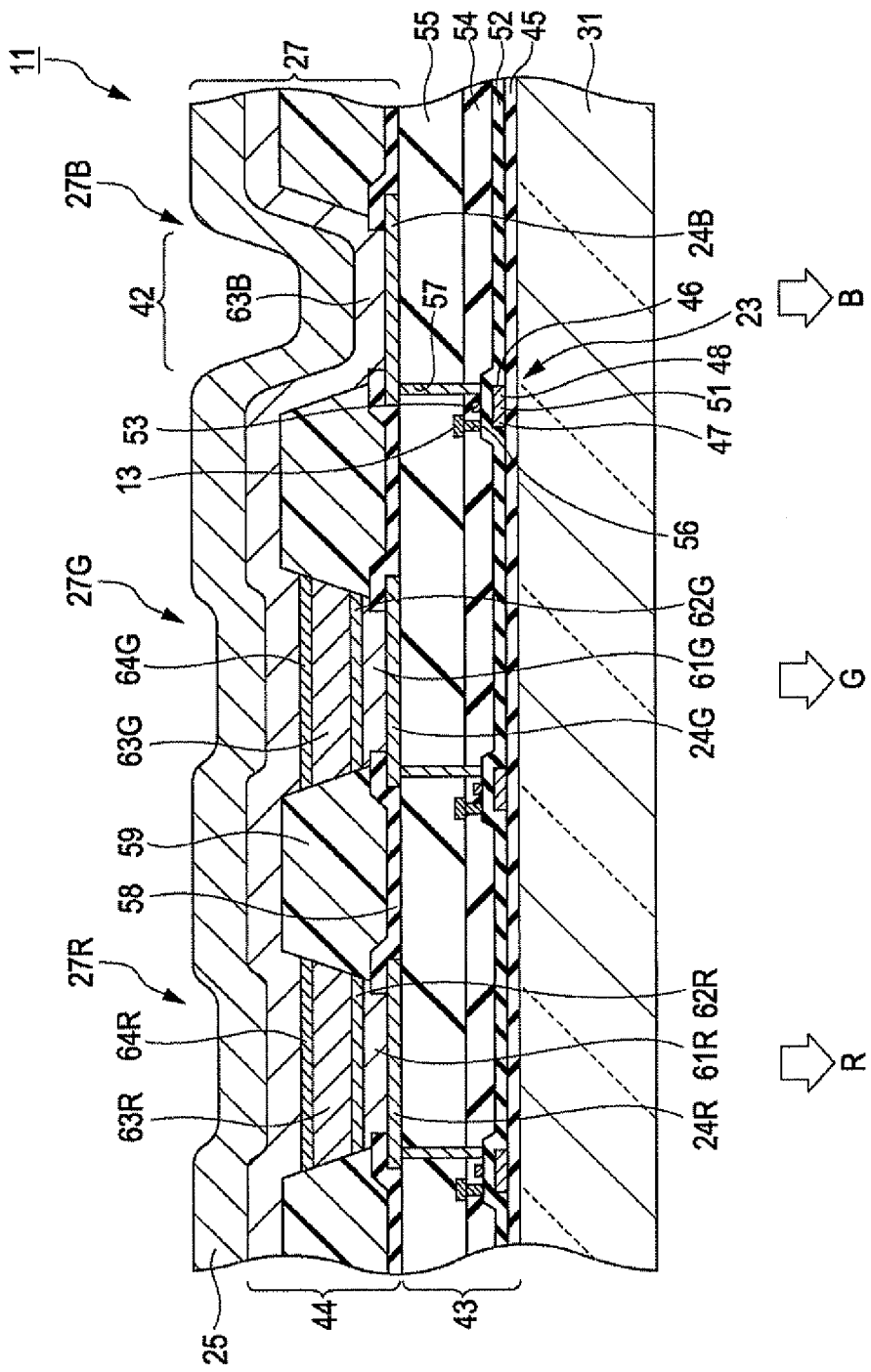
FIG. 3 is a schematic sectional view of the organic EL device.

FIG. 3 is a schematic sectional view of the organic EL device 11. The structure of the organic EL device 11 will now be described with reference to FIG. 3. FIG. 3 is a sectional view of the organic EL device 11, showing the positional relationship with such dimensional proportions as the components can be shown.

As shown in FIG. 3, the organic EL device 11 emits light in light-emitting regions 42, and includes the element substrate 31, a circuit element layer 43 on the element substrate 31, a light-emitting element layer 44 on the circuit element layer 43, a cathode (common electrode) 25 on the light-emitting element layer 44. The element substrate 31 may be made of an optically transparent glass.

In the circuit element layer 43, a silicon oxide ($SiO_2$) base protection film 45 is formed on the element substrate 31, and TFT elements 23 are formed on the base protection film 45. More specifically, polysilicon semiconductor films 46 are formed in an island manure on the base protection film 45. A source region 47 and a drain region 48 are formed in each semiconductor film 46 by implantation of an impurity. The region in which the impurity has not been implanted acts as a channel region 51.

The circuit element layer 43 further includes a transparent gate insulating layer 52 covering the base protection film 45 and the semiconductor films 46. The gate insulating layer 52 may be made of silicon oxide. On the gate insulating layer 52, gate electrodes 53 (scanning lines) are formed of aluminum (Al), molybdenum (Mo), tantalum (Ta), titanium (Ti), tungsten (W), or the like.

A transparent first insulating interlayer 54 and second insulating interlayer 55 are formed over the gate insulating layer 52 and the gate electrodes 53. The first insulating interlayer 54 and the second insulating interlayer 55 can be made of silicon oxide ($SiO_2$) or titanium oxide ($TiO_2$). Each gate electrode 53 is provided at a position opposing the channel region 51 of the semiconductor film 46.

The source region 47 of the semiconductor film 46 is electrically connected to the corresponding signal line 13 formed on the first insulating interlayer 54 through a contact hole 56 passing through the gate insulating layer 52 and the first insulating interlayer 54. The drain region 48 of the semiconductor film 46 is electrically connected to the anode 24 (24R, 24G or 24B) formed on the second insulating interlayer 55 through a contact hole 57 passing through the gate insulating layer 52, the first insulating interlayer 54 and the second insulating interlayer 55.

The anode 24 is provided for, for example, each light-emitting region 42. The anode 24 is made of transparent ITO (Indium Tin Oxide) and has a rectangular shape in plan view. The circuit element layer 43 further includes hold capacitors and switching transistors (not shown). Also, the circuit element layer 43 includes driving transistors, or TFT elements 23, connected to the respective anodes 24, as described above.

An insulating layer 58 and a partition member (bank) 59 are formed around the anodes 24 in a grid manner when viewed from above. The insulating layer 58 may be made of an inorganic material, such as silicon oxide ($SiO_2$). The insulating layer 58 overlaps the edges of the anodes 24 so that the adjacent anodes 24 can ensure an insulation therebetween, and that the light-emitting region 42 can have a desired shape (for example, track form). In other words, the anodes 24 and the insulating layer 58 partially coincide with each other when viewed from above. Hence, the insulating layer 58 is formed in the region other than the light-emitting regions 42.

The partition member 59 may have a trapezoidal section having a slanted side, and is formed so as to surround the light-emitting regions 42 (light-emitting elements 27R, 27G and 27B). Hence, the regions surrounded by the partition member 59 correspond to the openings of the partition member 59 and are defined as the light-emitting regions 42. The partition member 59 may be made of a heat-resistant and solvent-resistant organic material, such as an acrylic resin or a polyimide resin.

The layers formed over the anodes 24 differ according to the color of the light emitted from the light-emitting elements 27R, 27G and 27B. More specifically, in the red light-emitting element 27R, a hole injection layer 61R, a hole transport layer 62R, and a first luminescent layer (red luminescent layer) 63R are formed on a first anode 24R surrounded by the partition member 59 in that order by coating, such as an ink jet method. Furthermore, an intermediate layer 64R is formed on the first luminescent layer 63R by coating.

In the green light-emitting element 27G, a hole injection layer 61G, a hole transport layer 62G, and a second luminescent layer (green luminescent layer) 63G are formed in that order on a second anode 24G surrounded by the partition member 59 by coating, such as an ink jet method. Furthermore, an intermediate layer 64G is formed on the second luminescent layer 63G by coating, in the same manner as with the red light-emitting element 27R.

The hole injection layers 61 (61R and 61G) of the red and green light-emitting elements 27R and 27G are made of a conductive polymer containing a dopant. For example, the hole injection layer 61 may be made of 3,4-polyethylenedioxythiophene (PEDOT-PSS) doped with polystyrene sulfonic acid.

The hole transport layers 62 (62R and 62G) of the red and green light-emitting elements 27R and 27G are made of a material containing triphenylamine polymer such as tetrakis (4-fluorophenyl) borate (TFB) expressed by the following chemical formula (1):

(1)

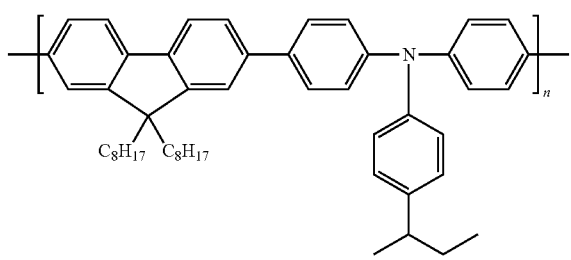

The luminescent layers 63 are organic luminescent layers exhibiting electroluminescence. For example, the red luminescent layer or first luminescent layer 63R may be made of the material expressed by chemical formula (2). The green luminescent layer or second luminescent layer 63G may be made of the material expressed by chemical formula (3).

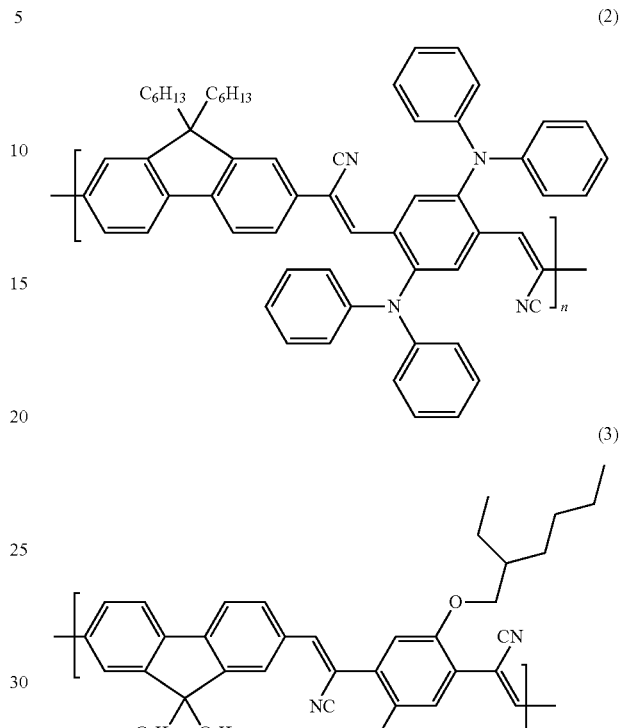

The intermediate layers 64 (64R and 64G) are each made of an alkali metal salt, or a multilayer composite of an oxide, a fluoride or a salt of an alkaline-earth metal and a metal oxide. For example, an alkali metal salt may be used in the present embodiment. For example the alkali metal salt can be cesium carbonate ($Cs_2CO_3$). For the intermediate layers 64 (64R and 64G) in the present embodiment, a solution of cesium carbonate may be applied by, for example, an ink jet method. The thickness of the intermediate layers 64 is, for example, 5 nm.

In the blue light-emitting element 27B, a third luminescent layer (blue luminescent layer) 63B is formed by vapor deposition on the third anode 24B surrounded by the partition member 59 and over the entire surface of the element substrate 31 including the surfaces of the intermediate layers 64R and 64G. The blue luminescent layer 63B has a multilayer structure including a layer of α-NPD having hole transport performance expressed by chemical formula (4), a layer of a blue light-emitting DPVBi expressed by chemical formula (5), and a layer of an Alq3 having electron transport performance expressed by chemical formula (6), in that order from the anode 24B side.

(4)

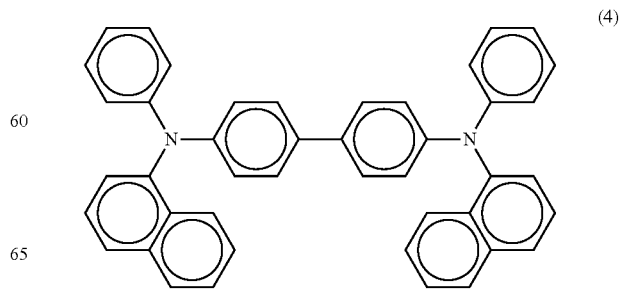

-continued

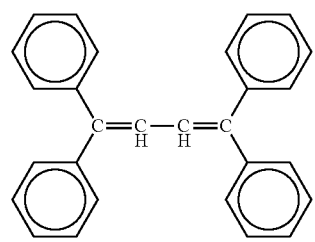
(5)

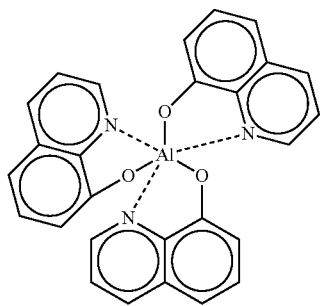
(6)

The cathode 25 is formed on the blue luminescent layer 63B over the entire surface of the element substrate 31. The cathode 25 may be a multilayer composite including, for example, a lithium fluoride (LiF) layer and an aluminum (Al) layer. The organic EL device 11 is sealed over the cathode 25 by, for example, can sealing (not shown). More specifically, a U-shaped glass or metal opposing substrate is bonded to the cathode side of the element substrate 31 with an adhesive, such as epoxy adhesive, with a desiccant contained in the space of the opposing substrate.

By applying a voltage between the anode 24 and the cathode 25, holes and electrons are injected to the corresponding luminescent layer 63 respectively from the anode 24 and the cathode 25. When the holes and the electrons are combined in the luminescent layer 63, light is emitted.

In the above-described structure, the red or green luminescent layer 63R or 63G formed by coating and the blue luminescent layer 63B formed by vapor deposition are disposed one on top the other with the intermediate layer 64R or 64G therebetween. This structure can enhance electron injection performance, and can smoothly transport the electrons from the cathode 25 to the red and green luminescent layers 63R and 63G.

Method from Manufacturing Organic EL Device

FIGS. 4 to 9 are schematic sectional views of process steps of a method for manufacturing the organic EL device 11, showing in sequential order. The method for manufacturing the organic EL device 11 will now be described with reference to FIGS. 4 to 9. Since the formation of the conductor lines, the electrodes, and the driving TFTs are performed in known process steps, these steps will be omitted or simplified, and subsequent steps will be described in detail below. Figures of the known process steps will be omitted or simplified.

Figure 4:
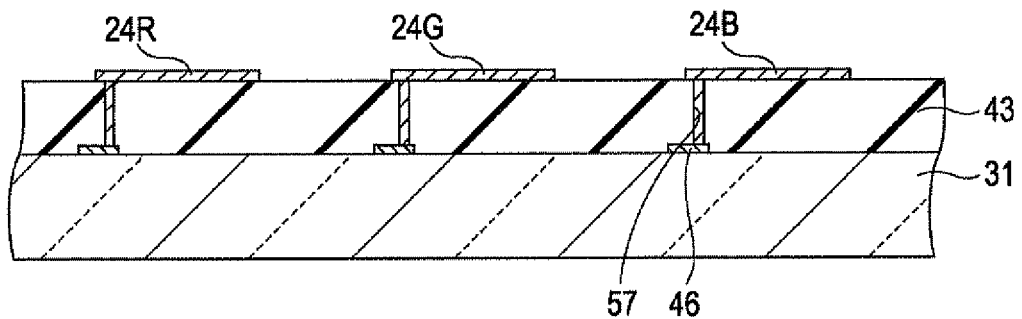
FIG. 4 is a schematic sectional view of a process step of a method for manufacturing the organic EL device, showing in sequential order.

First, as shown in FIG. 4, the circuit element layer 43 shown in FIG. 3 is formed on the element substrate 31 by a known method for forming a film, and ITO anodes 24 (24R, 24G and 24B) are formed on the circuit element layer 43.

Figure 5:
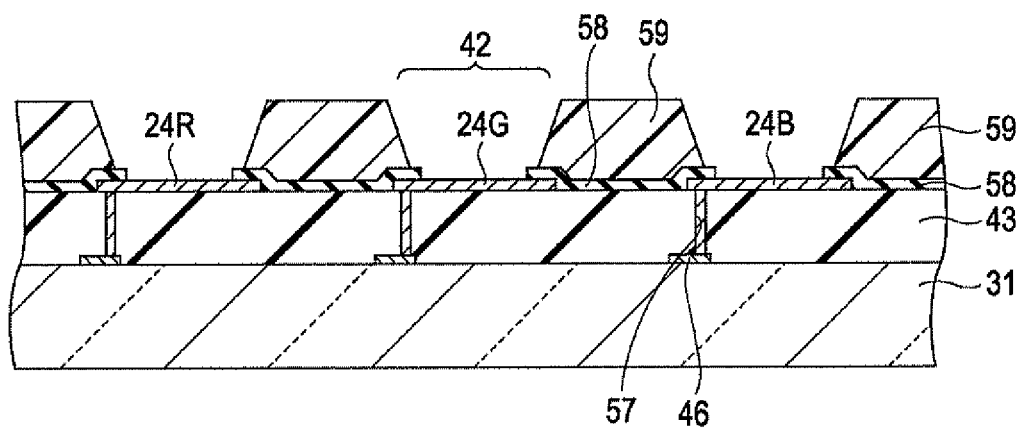
FIG. 5 is a schematic sectional view of a process step of the method for manufacturing the organic EL device, showing in sequential order.

Turning to FIG. 5, subsequently, the insulating layer 58 and the partition member 59 are formed on the circuit element layer 43 and the anodes 24. More specifically, for example, a silicon oxide (SiO$_2$) insulating layer 58 is formed so as to cover the circuit element layer 43 and the anodes 24 by chemical vapor deposition (CVD) or the like. Subsequently, openings are formed in the light-emitting regions 42 of the insulating layer 58 by photolithography and etching to complete the insulating layer 58.

Then, the partition member 59 is formed on the insulating layer 58. More specifically, first, a coating liquid containing the material of the partition member 59 is applied onto the insulating layer 58 and the anodes 24. The coating liquid may contain an acrylic resin. Then, the coating is dried to form a layer of the partition member. Openings are formed in the light-emitting regions 42 of the resulting layer. The partition member 59 is thus completed.

Figure 6:
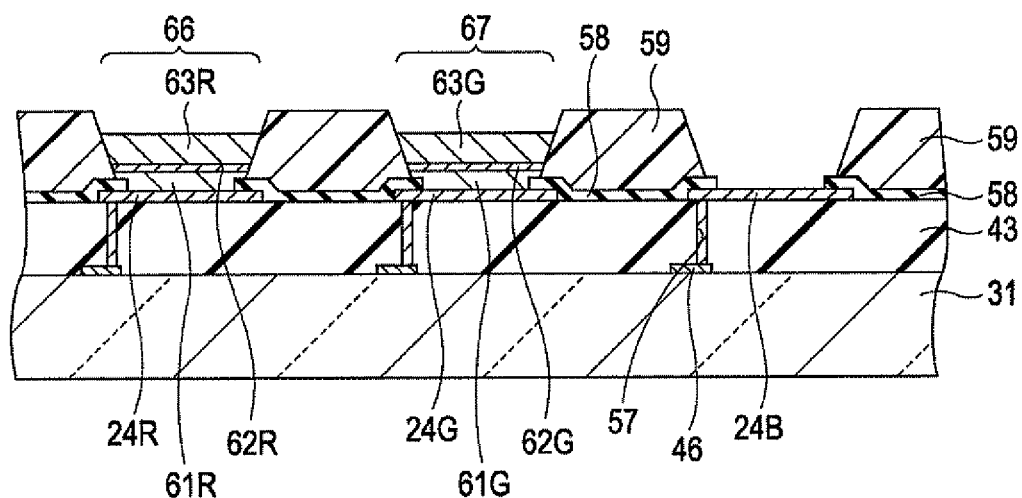
FIG. 6 is a schematic sectional view of a process step of the method for manufacturing the organic EL device, showing in sequential order.

Turning to FIG. 6, subsequently, hole injection layers 61 (61R and 61G), hole transport layers 62 (62R and 62G) and luminescent layers 63 (63R and 63G) are formed on the anodes 24 (24R and 24G) surrounded by the partition member 59 in the red light-emitting region 66 and the green light-emitting region 67, respectively (step of forming a first luminescent layer, and step of forming a second luminescent layer).

More specifically, a functional liquid containing the material of the hole injection layer 61 is ejected onto the anodes 24R and 24G by a liquid ejection method, such as an ink jet method, followed by drying. The functional liquid for the hole injection layer 61 may be a mixture of a polythiophene derivative, such as polyethylenedioxythiophene (PEDOT), and polystyrene sulfonic acid (PSS) added as a dopant (PEDOT/PSS).

Subsequently, a functional liquid containing the material of the hole transport layer 62 is ejected onto the hole injection layers 61 in the red light-emitting region 66 and the green light-emitting region 67 by, for example, an ink jet method, followed by drying. The functional liquid for the hole transport layer 62 may be a solution of, for example, TFB in a solvent. The solvent can be cyclohexylbenzene.

Subsequently, a functional liquid containing a material of the luminescent layers 63 (63R and 63G) is ejected onto the corresponding hole transport layer 62 by, for example, an ink jet method, followed by drying. For the red luminescent layer 63R, the functional liquid contains a solid content of a red fluorescent material. The functional liquid for the green luminescent layer 63G contains a solid content of a green fluorescent material.

Figure 7:
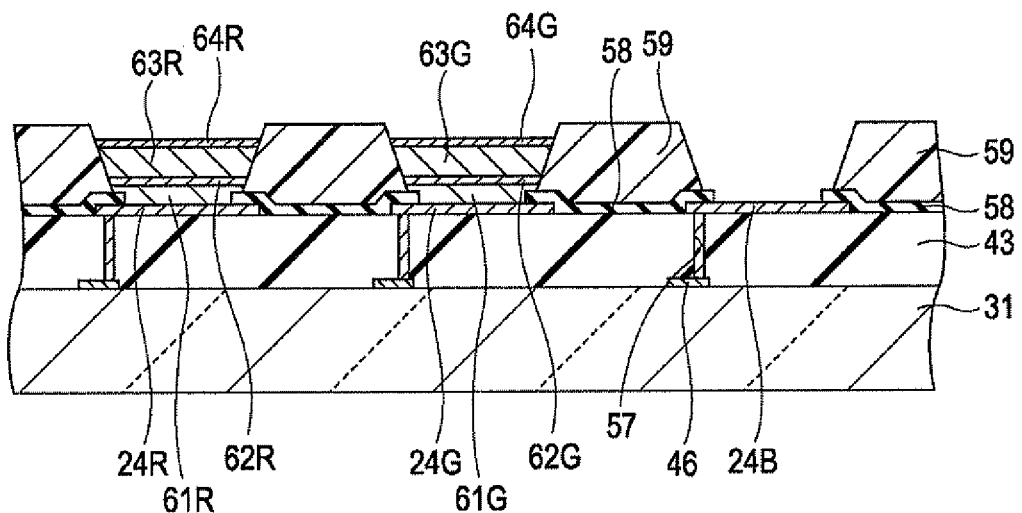
FIG. 7 is a schematic sectional view of a process step of the method for manufacturing the organic EL device, showing in sequential order.

Turning to FIG. 7, subsequently, intermediate layers 64 (64R and 64G) are formed on the red and green luminescent layers 63 (63R and 63G), respectively (step of forming an intermediate layer). More specifically, an aqueous solution of an alkali metal salt, such as cesium carbonate, is ejected onto the red and green luminescent layers 63R and 63G by, for example, an ink jet method, and the coatings of the solution are dried. The thickness of the intermediate layers 64 is, for example, 5 nm.

Figure 8:
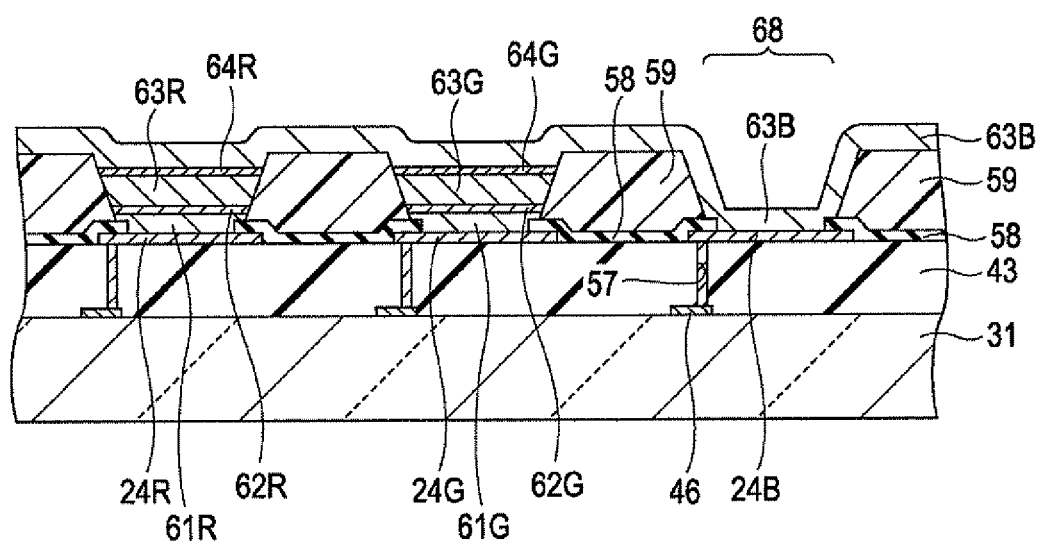
FIG. 8 is a schematic sectional view of a process step of the method for manufacturing the organic EL device, showing in sequential order.

Turning to FIG. 8, subsequently, the blue luminescent layer 63B is formed over the entire surfaces of the intermediate layers 64R and 64G, the anode 24B of the blue light-emitting region 68, and the partition member 59 by vapor deposition (step of forming a third luminescent layer by vapor deposition). More specifically, a multilayer structure is formed which includes a α-NPD layer having hole transport performance, a DPVBi blue luminescent layer, and an Alq3 layer having electron transport performance in that order from the anode 24B side.

Figure 9:
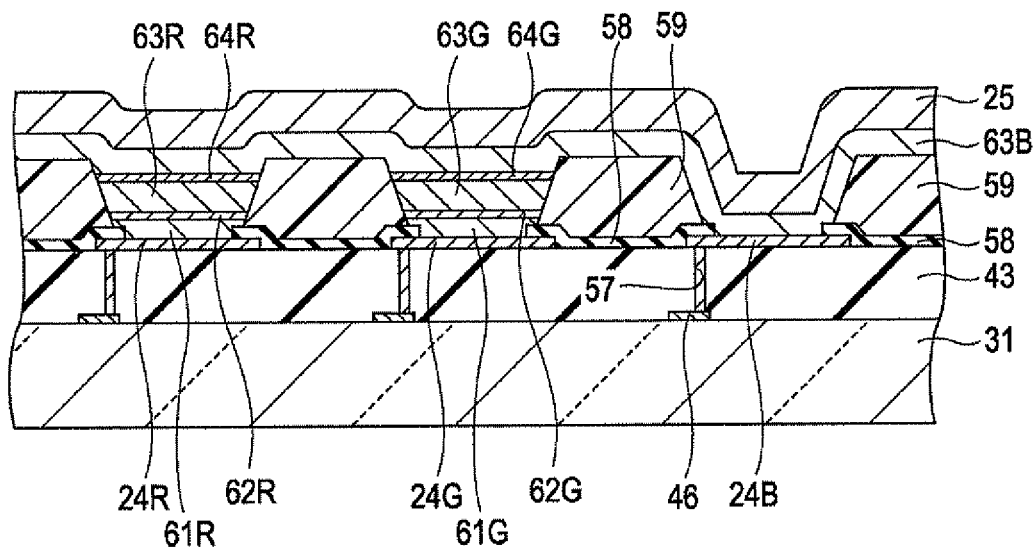
FIG. 9 is a schematic sectional view of a process step of the method for manufacturing the organic EL device, showing in sequential order.

Then, the cathode 25 is formed on the blue luminescent layer 63B, followed by sealing over the cathode 25 (step of forming a cathode), as shown in FIG. 9. For example, the cathode 25 is formed by depositing lithium fluoride and aluminum in that order by vapor deposition. For the sealing, can sealing may be applied. Thus the organic EL device 11 is completed.

The first embodiment produces the following effects.

(1) Since the red or green luminescent layer 63R or 63G formed by, for example, an ink jet method, and the blue luminescent layer 63B formed by vapor deposition are disposed one on top the other with the intermediate layer 64R or 64G of, for example, an alkali metal salt therebetween, the electron injection performance can be enhanced between the blue luminescent layer 63B and the red and green luminescent layers 63R and 63G. Accordingly, electrons from the cathode 25 can be smoothly transferred to the red and green luminescent layers 63R and 63G. Consequently, the light-emitting elements 27 can emit light over a long term; hence the lifetime of the organic EL device 11 can be enhanced more than that of the structure not including the intermediate layer 64.

(2) Since the blue luminescent layer 63B is formed by vapor deposition, the electrical characteristics can be enhanced more than the case where the blue luminescent layer is formed by coating, and hence high quality images can be displayed.

Second Embodiment

Structure of Organic EL Device

Figure 10:
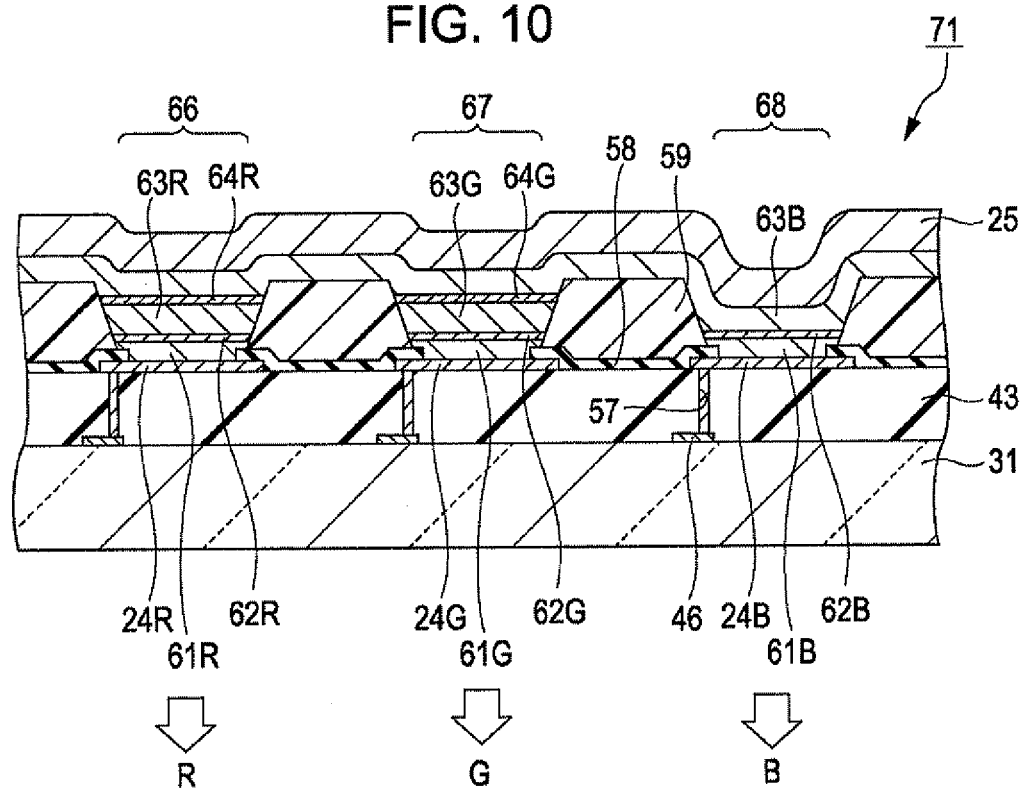
FIG. 10 is a schematic sectional view of an organic EL device according to a second embodiment of the invention.

FIG. 10 is a schematic sectional view of an organic EL device according to a second embodiment of the invention. The structure of the organic EL device will now be described with reference to FIG. 10.

The organic EL device 71 of the second embodiment is different from that of the first embodiment in that the blue light-emitting region 68 includes a hole injection layer 61B and a hole transport layer 62B between the anode 24B and the blue luminescent layer 63B. In the drawings for the following description, the same parts as in the first embodiment are designated by the same reference numerals, and descriptions of these parts will be omitted or simplified.

As shown in FIG. 10, the organic EL device 71 of the present embodiment includes an element substrate 31, a circuit element layer 43 on the element substrate 31, anodes 24 (24R, 24G and 24B) on the circuit element layer 43, an insulating layer 58, and a partition member 59, as in the first embodiment.

Hole injection layers 61 (61R, 61G and 61B) and hole transport layers 62 (62R, 62G and 62B) are formed on the respective anodes 24 (24R, 24G and 24B) surrounded by the partition member 59 by, for example, an ink jet method. The difference from the first embodiment is that the hole injection layer 61 and the hole transport layer 62 are provided in the blue light-emitting region 68 as well as the red and green light-emitting regions 66 and 67.

In the red light-emitting region 66, a red luminescent layer 63R and an intermediate layer 64R are formed in that order on the hole transport layer 62R by, for example, an ink jet method. This structure is the same as in the first embodiment.

In the green light-emitting region 67, a green luminescent layer 63G and an intermediate layer 64G are formed in that order on the hole transport layer 62G by, for example, an ink jet method. This structure is the same as in the first embodiment.

The blue luminescent layer 63B is formed by vapor deposition, as in the first embodiment, over the entire surface of the element substrate 31 including the surfaces of the intermediate layers 64R and 64G, the hole transport layer 62B of the blue light-emitting region 68 and the partition member 59. In the second embodiment, since the hole injection layer 61B and the hole transport layer 62B are disposed on the anode 24B of the blue light-emitting region 68, the blue luminescent layer 63B may not include the α-NPD layer having hole transport performance of the three layers constituting the blue luminescent layer 63B in the first embodiment. Then a cathode 25 covers the entire surface of the blue luminescent layer 63B.

Method for Manufacturing Organic EL Device

Figure 11:
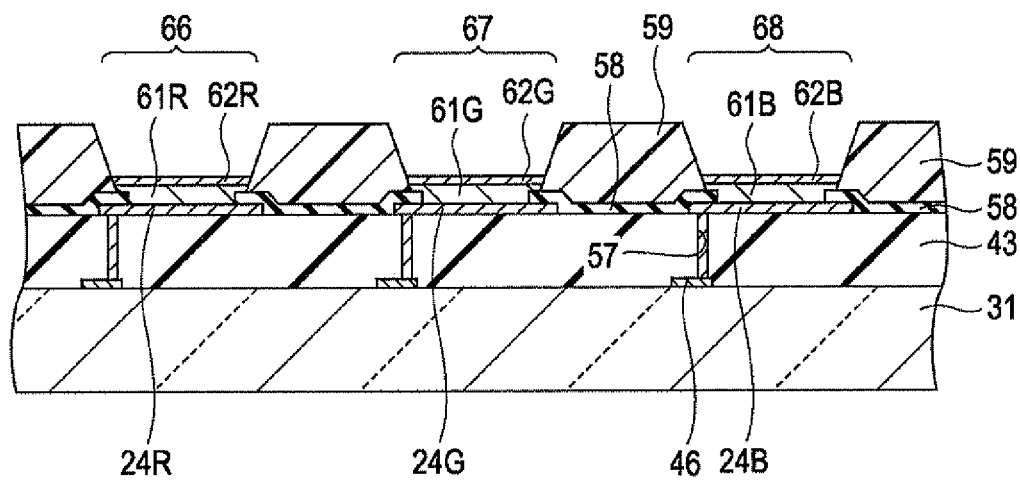
FIG. 11 is a schematic sectional view of a process step of a method for manufacturing the organic EL device, showing in sequential order.
Figure 12:
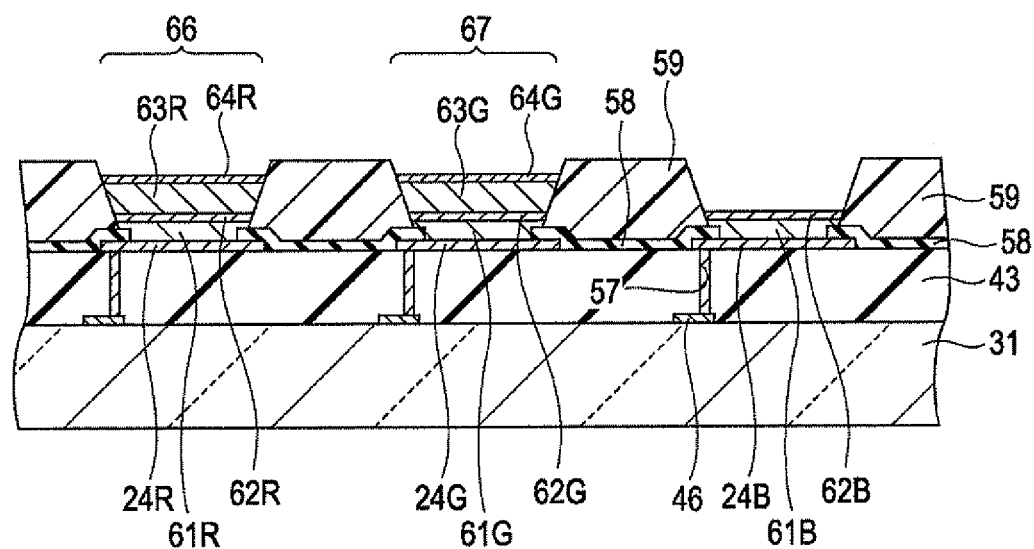
FIG. 12 is a schematic sectional view of a process step of the method for manufacturing the organic EL device, showing in sequential order.
Figure 13:
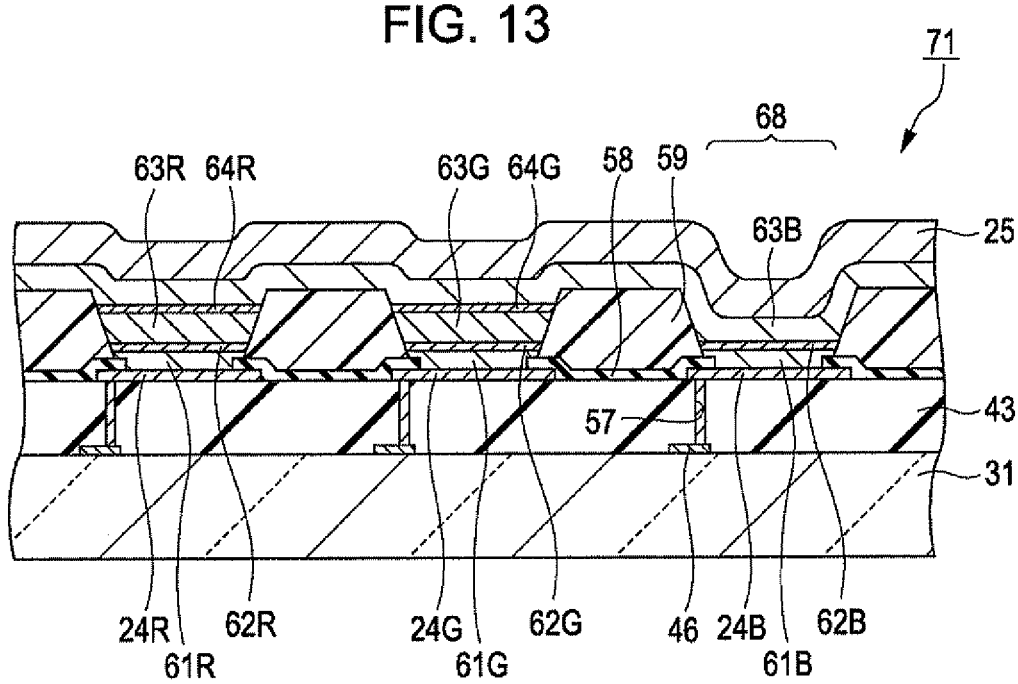
FIG. 13 is a schematic sectional view of a process step of the method for manufacturing the organic EL device, showing in sequential order.

FIGS. 11 to 13 are schematic sectional views of process steps of a method for manufacturing the organic EL device 71 according the second embodiment, showing in sequential order. The method for manufacturing the organic EL device 71 will now be described with reference to FIGS. 11 to 13. In the drawings for the following description, the same parts as in the first embodiment are designated by the same reference numerals, and descriptions of these parts will be omitted or simplified.

First, as shown in FIG. 11, the hole injection layer 61 and the hole transport layer 62 are formed on the anode 24 surrounded by the partition member 59 by, for example, an ink jet method in each of the light-emitting regions 66, 67 and 68. More specifically, in the red light-emitting region 66, the hole injection layer 61R and the hole transport layer 62R are formed in that order on the anode 24R. In the green light-emitting region 67, the hole injection layer 61G and the hole transport layer 62G are formed in that order on the anode 24G. In the blue light-emitting region 68, the hole injection layer 61B and the hole transport layer 62B are formed in that order on the anode 24B. The process for forming the hole injection layers 61 and the hole transport layers 62 are performed in the same manner as in the first embodiment.

Turning to FIG. 12, subsequently, luminescent layers 63R and 63G and intermediate layers 64R and 64G are formed on the respective hole transport layers 62R and 62G in the red and green light-emitting regions 66 and 67 by, for example, an ink jet method, in the same as in the first embodiment.

Turning to FIG. 13, subsequently, the blue luminescent layer 63B is formed over the entire surfaces of the intermediate layers 64R and 64G, the hole transport layer 62B of the blue light-emitting region 68, and the partition member 59 by vapor deposition. More specifically, a multilayer structure is formed which includes an α-NPD layer having hole transport performance, a DPVBi blue luminescent layer, and an Alq3 layer having electron transport performance in that order from the hole transport layer 62B side. Then, the cathode 25 is formed on the blue luminescent layer 63B to complete the organic EL device 71.

The second embodiment produces the following effects in addition to the effects (1) and (2) of the first embodiment.

(3) Since the hole injection layer 61 and the hole transport layer 62 are formed on the anode 24B of the blue light-emitting region 68 as well as the anodes 24R and 24G of the red and green light-emitting regions 66 and 67, unevenness of the surface over the anodes 24 can be reduced. Consequently, occurrence of problems can be prevented, such as leakage current in the organic EL device 71 and dark spots.

(4) Since the hole injection layer 61 and the hole transport layer 62 are formed on the anode 24B of the blue light-emitting region 68 as well as the anodes 24R and 24G of the red and green light-emitting regions 66 and 67, the performance of hole transport from the anode 24 can be enhanced.

Third Embodiment

Structure of Organic EL Device

Figure 14:
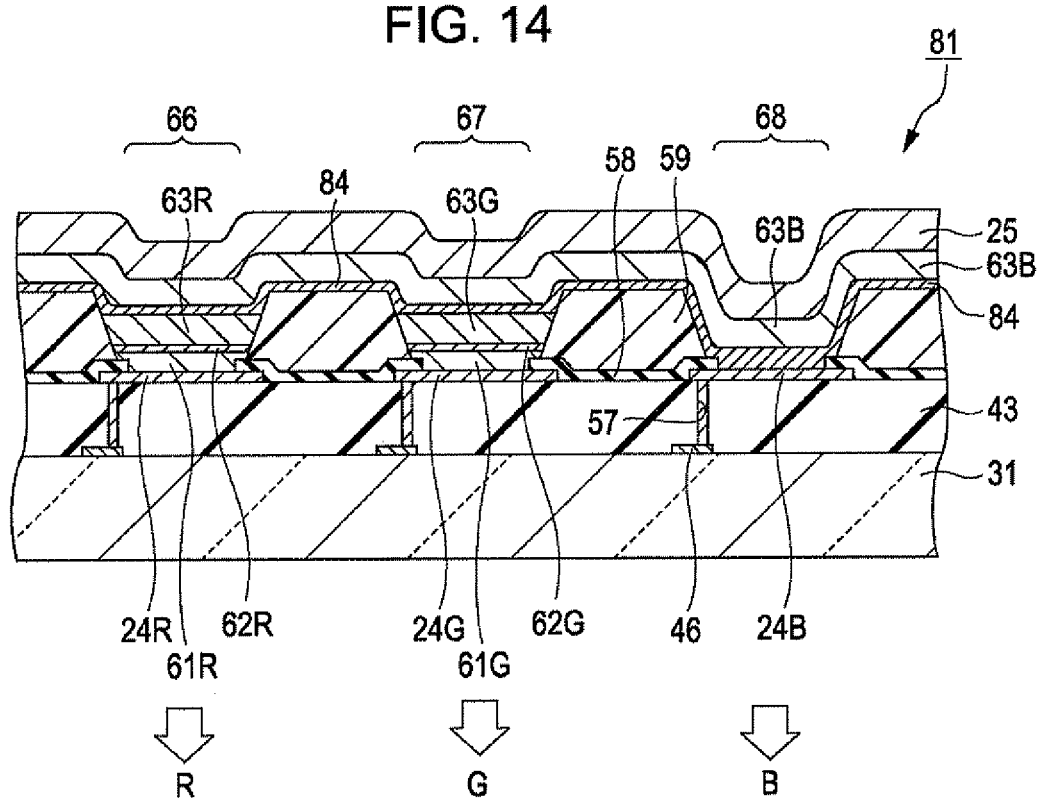
FIG. 14 is a schematic sectional view of an organic EL device according to a third embodiment of the invention.

FIG. 14 is a schematic sectional view of an organic EL device according to a third embodiment of the invention. The structure of the organic EL device will now be described with reference to FIG. 14.

The organic EL device 81 of the third embodiment is different from that of the first embodiment in that an intermediate layer 84 is formed over the entirety of the light-emitting regions 66, 67 and 68. In the drawings for the following description, the same parts as in the first embodiment are designated by the same reference numerals, and descriptions of these parts will be omitted or simplified.

As shown in FIG. 14, the organic EL device 81 of the present embodiment includes an element substrate 31, a circuit element layer 43 on the element substrate 31, anodes 24 (24R, 24G and 24B) on the circuit element layer 43, an insulating layer 58, and a partition member 59, as in the first embodiment.

Hole injection layers 61 (61R and 61G), hole transport layers 62 (62R and 62G), and a red and a green luminescent layer 61 (61R and 61G) are formed by, for example, an ink jet method, on the respective anodes 24 (24R and 24G) of the red and green light-emitting regions 66 and 67 surrounded by the partition member 59. These layers are formed in the same manner as in the first embodiment.

The intermediate layer 84, which is a feature of the third embodiment, is formed by vapor deposition over the entire surface of the element substrate 31 including the surfaces of the red and green luminescent layers 63R and 63G, the anode 24B of the blue light-emitting region 68 and the partition member 59. Preferably, the intermediate layer 84 has electron inject performance.

A blue luminescent layer 63B is formed on the intermediate layer 84 by vapor deposition. Then a cathode 25 covers the entire surface of the blue luminescent layer 63B.

Method for Manufacturing Organic EL Device

Figure 15:
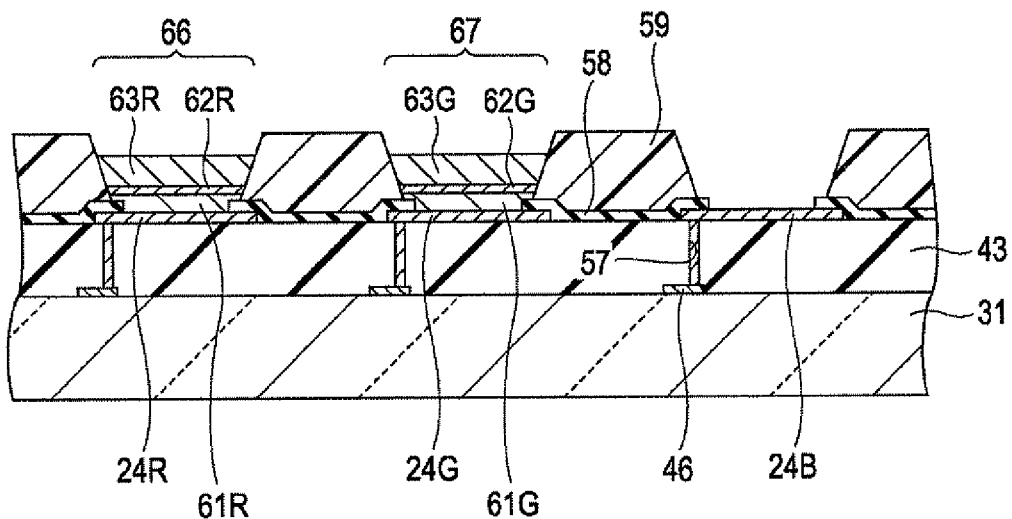
FIG. 15 is a schematic sectional view of a process step of a method for manufacturing the organic EL device, showing in sequential order.
Figure 16:
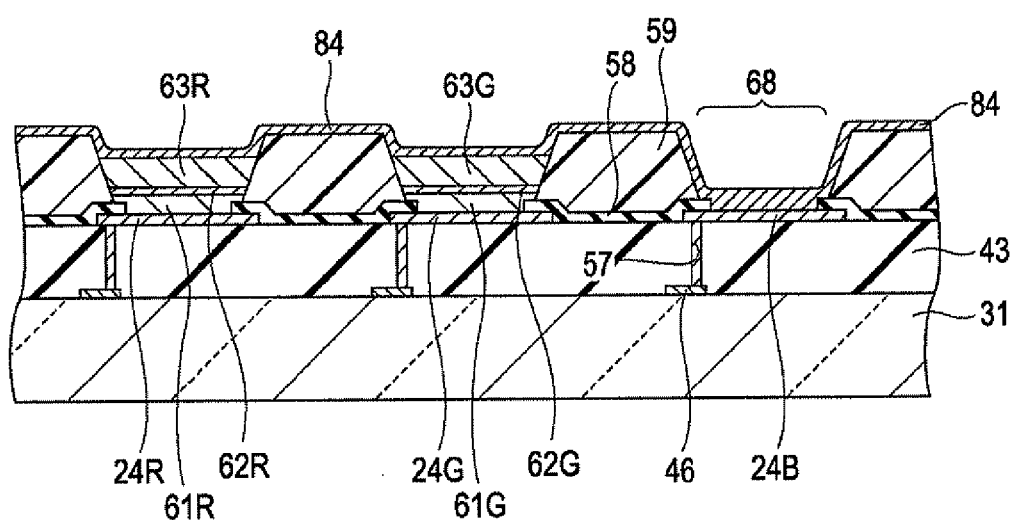
FIG. 16 is a schematic sectional view of a process step of the method for manufacturing the organic EL device, showing in sequential order.
Figure 17:
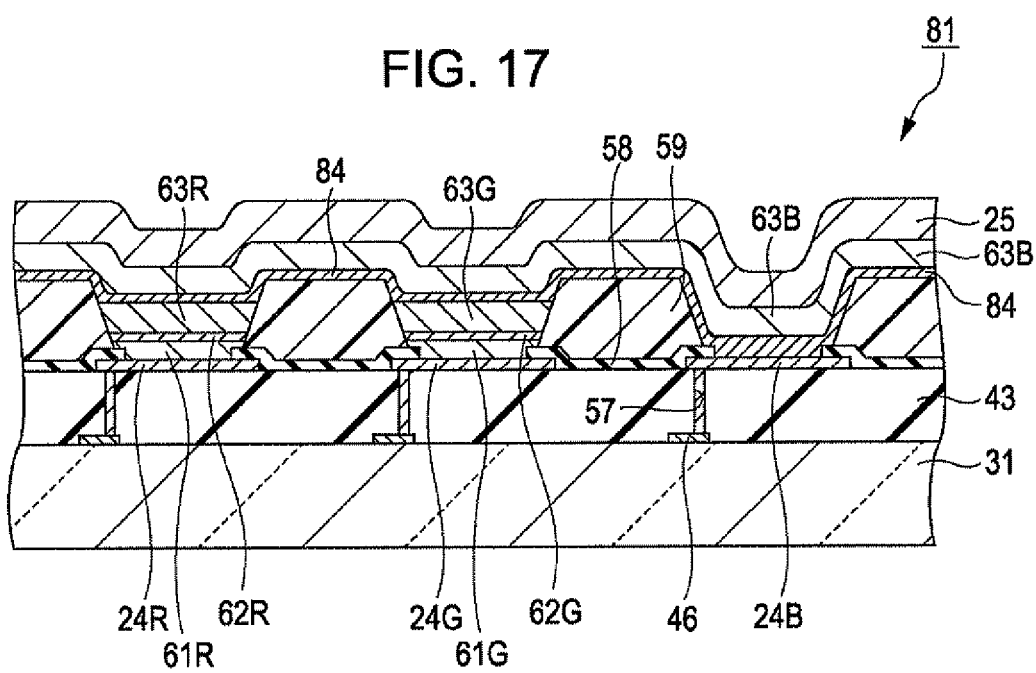
FIG. 17 is a schematic sectional view of a process step of the method for manufacturing the organic EL device, showing in sequential order.

FIGS. 15 to 17 are schematic sectional views of process steps of the method for manufacturing the organic EL device 81 according the third embodiment, showing in sequential order. The method for manufacturing the organic EL device 81 will now be described with reference to FIGS. 15 to 17. In the drawings for the following description, the same parts as in the first embodiment are designated by the same reference numerals, and descriptions of these parts will be omitted or simplified.

First, as shown in FIG. 15, the hole injection layer 61, the hole transport layer 62, and the red or green luminescent layer 63 (63R or 63G) are formed by, for example, an ink jet method, on the anodes 24 surrounded by the partition member 59 in the red and green light-emitting regions 66 and 67.

More specifically, in the red light-emitting region 66, the hole injection layer 61R, the hole transport layer 62R and the red luminescent layer 63R are formed in that order on the anode 24R. In the green light-emitting region 67, the hole injection layer 61G, the hole transport layer 62G and the green luminescent layer 63G are formed in that order on the anode 24G. The formation of the hole injection layers 61, the hole transport layers 62 and the red and green luminescent layers 63R and 63G are performed in the same manner as in the first embodiment.

Turning to FIG. 16, subsequently, the intermediate layer 84 is formed by vapor deposition over the entire surface of the element substrate 31 including the surfaces of the red and green luminescent layers 63R and 63G, the anode 24B of the blue light-emitting region 68 and the partition member 59. The intermediate layer 84 can be formed of, for example, cesium carbonate ($Cs_2CO_3$) as in the first embodiment. Since the intermediate layer 84 is formed by vapor deposition, the material can be selected from a wide range of materials. Lithium fluoride may be used instead of cesium carbonate. Preferably, whether or not the intermediate layer 84 is formed in the blue light-emitting region 68 is determined according to the characteristics of the blue luminescent layer 63B, such as hole transport performance or electron transport performance.

Turning to FIG. 17, subsequently, the blue luminescent layer 63B and the cathode 25 are formed on the intermediate layer 84 by vapor deposition. More specifically, a multilayer structure is formed which includes an α-NPD layer having hole transport performance, a DPVBi blue luminescent layer, and an Alq3 layer having electron transport performance in that order from the intermediate layer 84 side. Then, the cathode 25 is formed on the blue luminescent layer 63B to complete the organic EL device 81.

The third embodiment produces the following effect in addition to the effects (1) and (2) of the first embodiment.

(5) Since the intermediate layer 84 is formed over the entire surface of the element substrate 31 by vapor deposition, the resulting layer can be more uniform than the intermediate layer formed by coating, and the material can be selected from a wide range of materials.

Forth Embodiment

Structure of Organic EL Device

Figure 18:
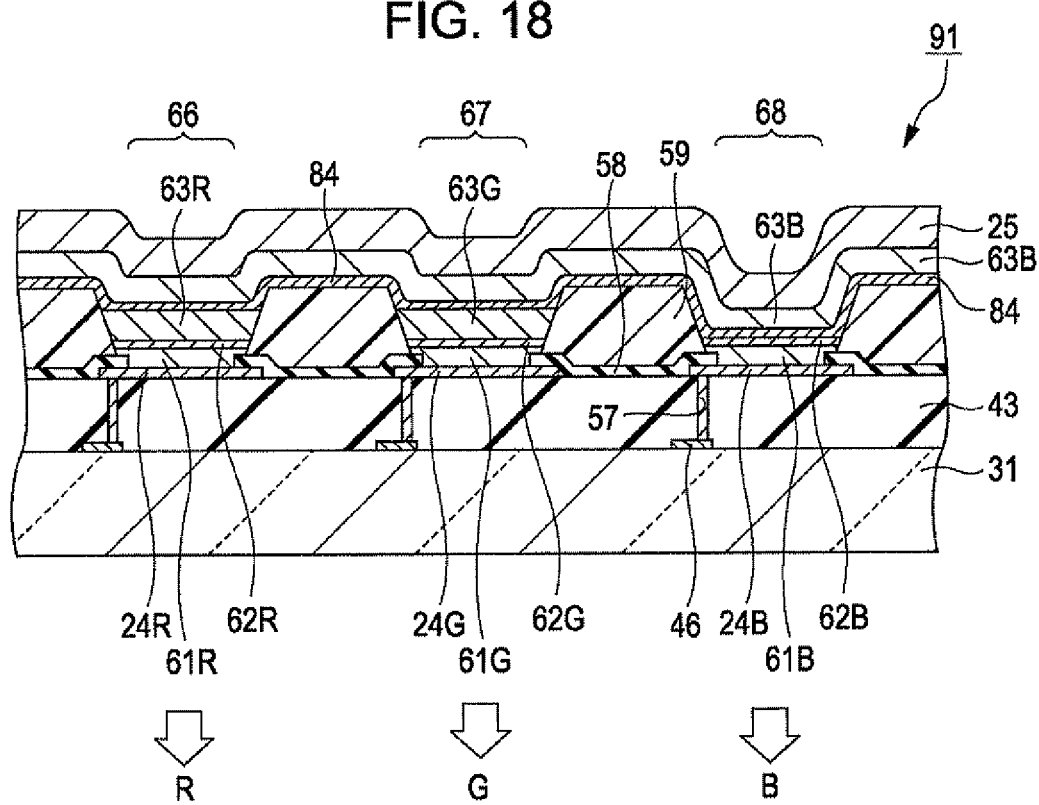
FIG. 18 is a schematic sectional view of an organic EL device according to a fourth embodiment of the invention.

FIG. 18 is a schematic sectional view of an organic EL device according to a fourth embodiment of the invention. The structure of the organic EL device will now be described with reference to FIG. 18.

The organic EL device 91 of the fourth embodiment is different from that of the first embodiment in that the hole injection layer 61 and the hole transport layer 62 are provided in all the light-emitting regions 66, 67 and 68, and in that an intermediate layer 84 is provided over the entire surfaces of all the light-emitting regions 66, 67 and 68 and the partition member 59. In the drawings for the following description, the same parts as in the first embodiment are designated by the same reference numerals, and descriptions of these parts will be omitted or simplified.

As shown in FIG. 18, the organic EL device 91 of the present embodiment includes an element substrate 31, a circuit element layer 43 on the element substrate 31, anodes 24 (24R, 24G and 243) on the circuit element layer 43, an insulating layer 58, and a partition member 59, as in the first embodiment.

Hole injection layers 61 (61R, 61G and 61B) and hole transport layers 62 (62R, 62G and 62B) are formed by, for example, coating, such as an ink jet method, on the respective anodes 24 (24R, 24G and 24B) surrounded by the partition member 59 in the light-emitting regions 66, 67 and 68. These layers are formed in the same manner as in the first embodiment.

In the red light-emitting region 66, a red luminescent layer 63R is disposed on the hole transport layer 62R. In the green light-emitting region 67, a green luminescent layer 63G is disposed on the hole transport layer 62G. The red and green luminescent layers 63R and 63G are formed by, for example, an ink jet method.

An intermediate layer 84 is formed by vapor deposition over the entire surface of the element substrate 31 including the surfaces of the red and green luminescent layers 63R and 63G, the hole transport layer 623 of the blue light-emitting region 68, and the partition member 59. On the intermediate layer 84, a blue luminescent layer 633 and a cathode 25 are formed in that order by vapor deposition.

Method for Manufacturing Organic EL Device

Figure 19:
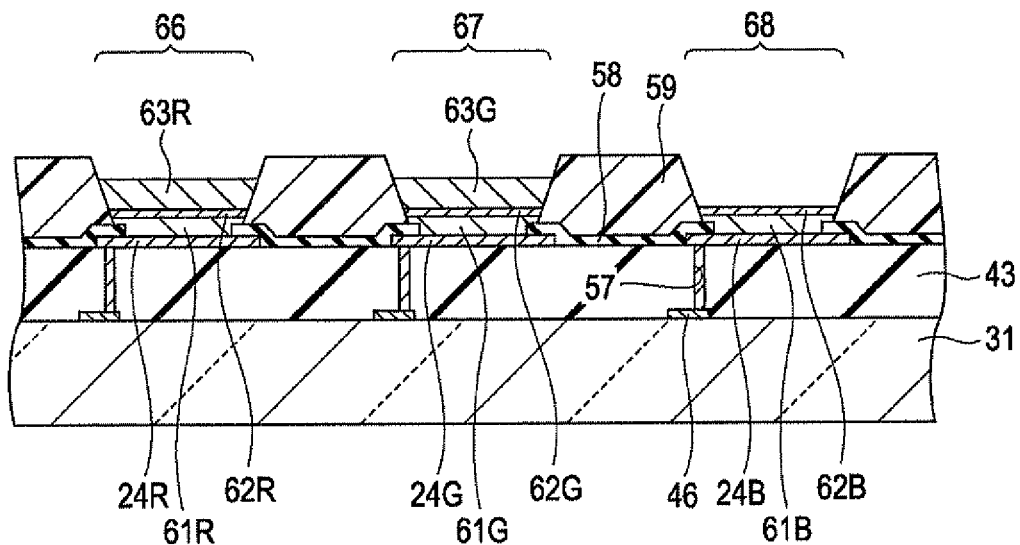
FIG. 19 is a schematic sectional view of a process step of a method for manufacturing the organic EL device, showing in sequential order.
Figure 20:
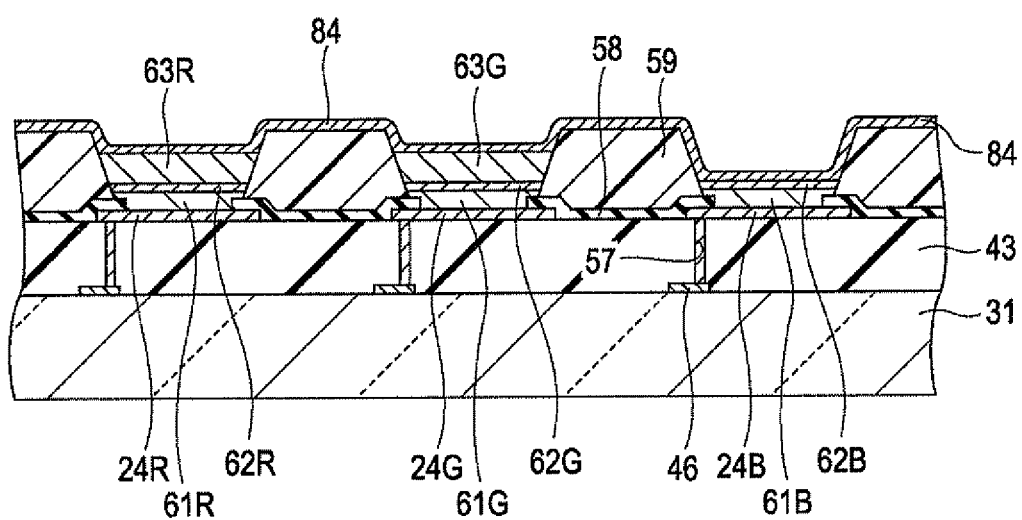
FIG. 20 is a schematic sectional view of a process step of the method for manufacturing the organic EL device, showing in sequential order.
Figure 21:
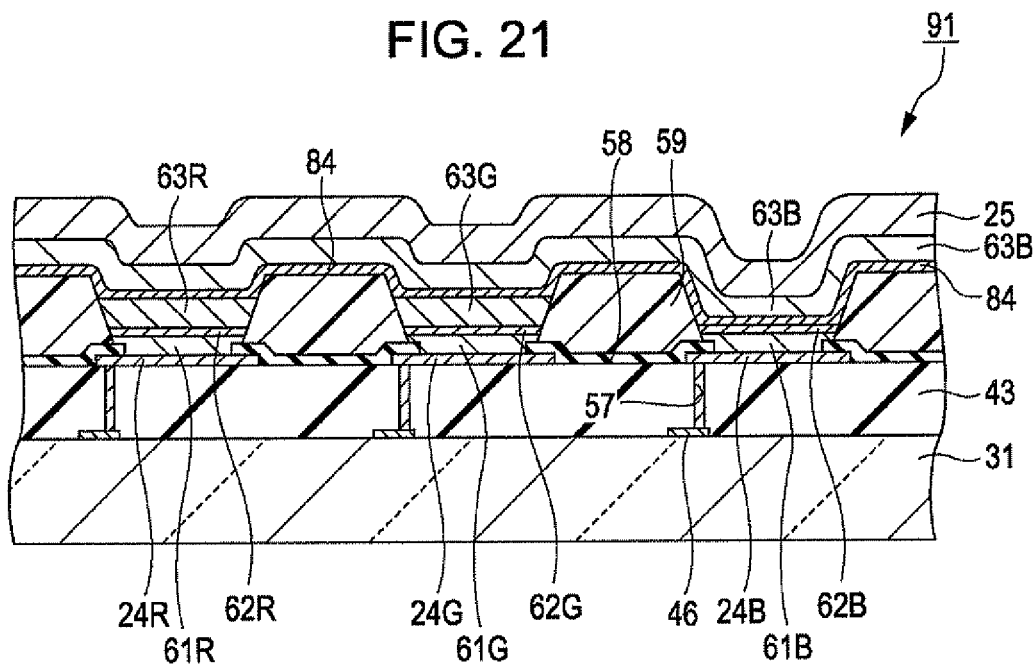
FIG. 21 is a schematic sectional view of a process step of the method for manufacturing the organic EL device, showing in sequential order.

FIGS. 19 to 21 are schematic sectional views of process steps of the method for manufacturing the organic EL device according the fourth embodiment, showing in sequential order. The method for manufacturing the organic EL device 91 will now be described with reference to FIGS. 19 to 21. In the drawings for the following description, the same parts as in the first embodiment are designated by the same reference numerals, and descriptions of these parts will be omitted or simplified.

First, as shown in FIG. 19, the hole injection layer 61 and the hole transport layer 62 are formed on the anode 24 surrounded by the partition member 59 by, for example, an ink jet method, for each of the light-emitting regions 66, 67 and 68.

More specifically, in the red light-emitting region 66, the hole injection layer 61R and the hole transport layer 62R are formed in that order on the anode 24R. In the green light-emitting region 67, the hole injection layer 61G and the hole transport layer 62G are formed in that order on the anode 24G. In the blue light-emitting region 68, the hole injection layer 61B and the hole transport layer 62B are formed in that order on the anode 24B.

Subsequently, the red luminescent layer 63R is formed on the hole transport layer 62R of the red light-emitting region 66 by, for example, an ink jet method. Also, the green luminescent layer 63G is formed on the hole transport layer 62G of the green light-emitting region 67 by, for example, an ink jet method.

Turning to FIG. 20, subsequently, the intermediate layer 84 is formed by vapor deposition over the entire surface of the element substrate 31 including the surfaces of the red and green luminescent layers 63R and 63G, the hole transport layer 62B of the blue light-emitting region 68, and the partition member 59.

Turning to FIG. 21, subsequently, the blue luminescent layer 63B and the cathode 25 are formed on the intermediate layer 84 by vapor deposition. More specifically, a multilayer structure is formed which includes an α-NPD layer having hole transport performance, a DPVBi blue luminescent layer, and an Alq3 layer having electron transport performance in that order from the intermediate layer 84 side. Then, the cathode 25 is formed on the blue luminescent layer 63B to complete the organic EL device 91.

The fourth embodiment can produce the effects (1) to (5) of the above-described embodiments.

Fifth Embodiment

Structure of Organic EL Device

Figure 22:
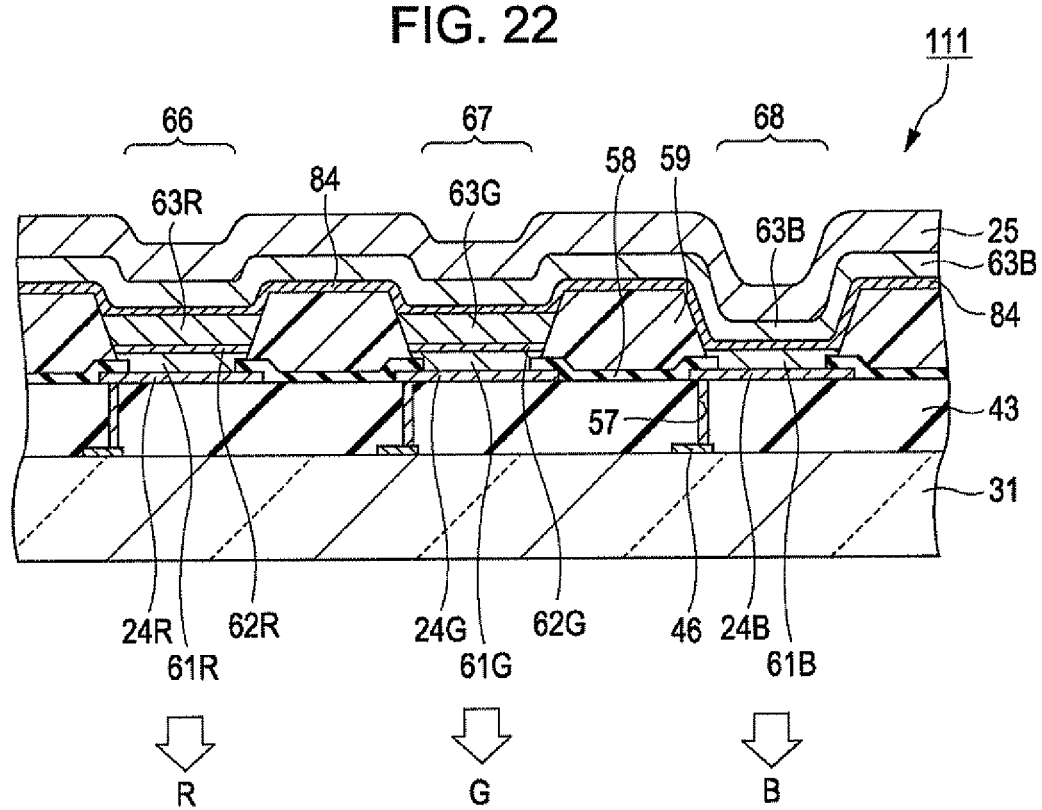
FIG. 22 is a schematic sectional view of an organic EL device according to a fifth embodiment of the invention.

FIG. 22 is a schematic sectional view of an organic EL device according to a fifth embodiment of the invention. The structure of the organic EL device will now be described with reference to FIG. 22.

The organic EL device 111 of the fifth embodiment is different from that in the fourth embodiment in that the hole injection layer 61 and the hole transport layer 62 are provided in the red and green light-emitting regions 66 and 67 while only the hole injection layer 61 is provided in the blue light-emitting region 68. In the drawings for the following description, the same parts as in the fourth embodiment are designated by the same reference numerals, and descriptions of these parts will be omitted or simplified.

As shown in FIG. 22, the organic EL device 111 of the present embodiment includes an element substrate 31, a circuit element layer 43 on the element substrate 31, anodes 24 (24R, 24G and 24B) on the circuit element layer 43, an insulating layer 58, and a partition member 59, as in the fourth embodiment.

Hole injection layers 61 (61R, 61G and 61B) are formed by, for example, an ink jet method, on the respective anodes 24 (24R, 24G and 24B) surrounded by the partition member 59 in the light-emitting regions 66, 67 and 68. These layers are formed in the same manner as in the fourth embodiment.

In addition, hole transport layers 62 (62R and 62G) are formed on the respective hole injection layers 61 (61R and 61G) of the red and green light-emitting regions 66 and 67 by, for example, an ink jet method. These layers are formed in the same manner as in the fourth embodiment.

In the red light-emitting region 66, a red luminescent layer 63R is disposed on the hole transport layer 62R. In the green light-emitting region 67, a green luminescent layer 63G is disposed on the hole transport layer 62G. The red and green luminescent layers 63R and 63G are formed by, for example, an ink jet method.

An intermediate layer 84 is formed by vapor deposition over the entire surface of the element substrate 31 including the surfaces of the red and green luminescent layers 63R and 63G, the hole injection layer 61B of the blue light-emitting region 68, and the partition member 59. On the intermediate layer 84, a blue luminescent layer 63B and a cathode 25 are formed in that order by vapor deposition.

Method for Manufacturing Organic EL Device

Figure 23:
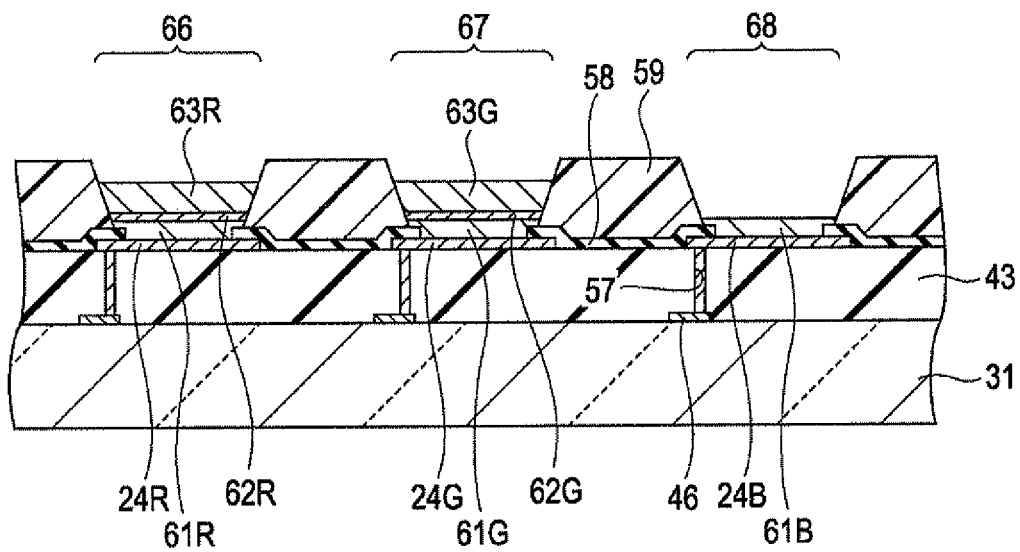
FIG. 23 is a schematic sectional view of a process step of a method for manufacturing the organic EL device, showing in sequential order.
Figure 24:
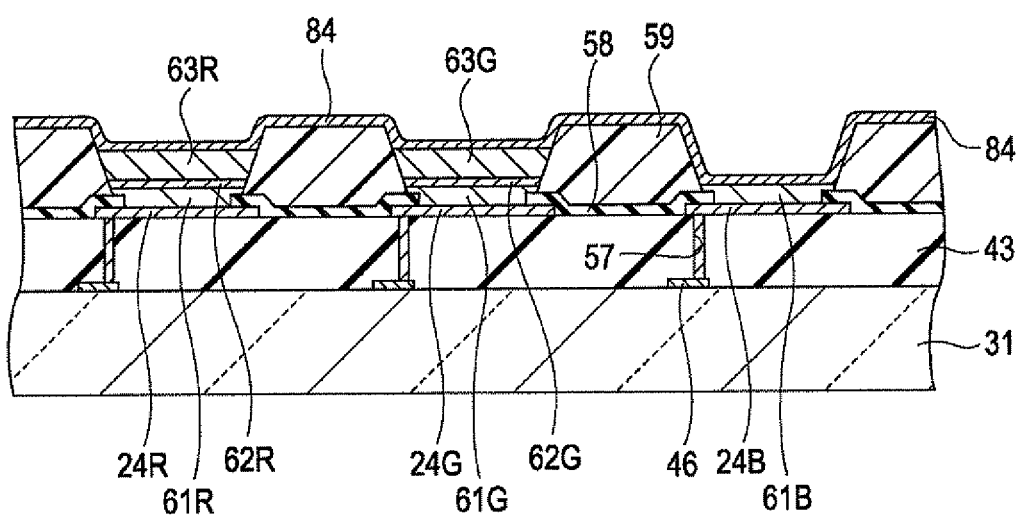
FIG. 24 is a schematic sectional view of a process step of the method for manufacturing the organic EL device, showing in sequential order.
Figure 25:
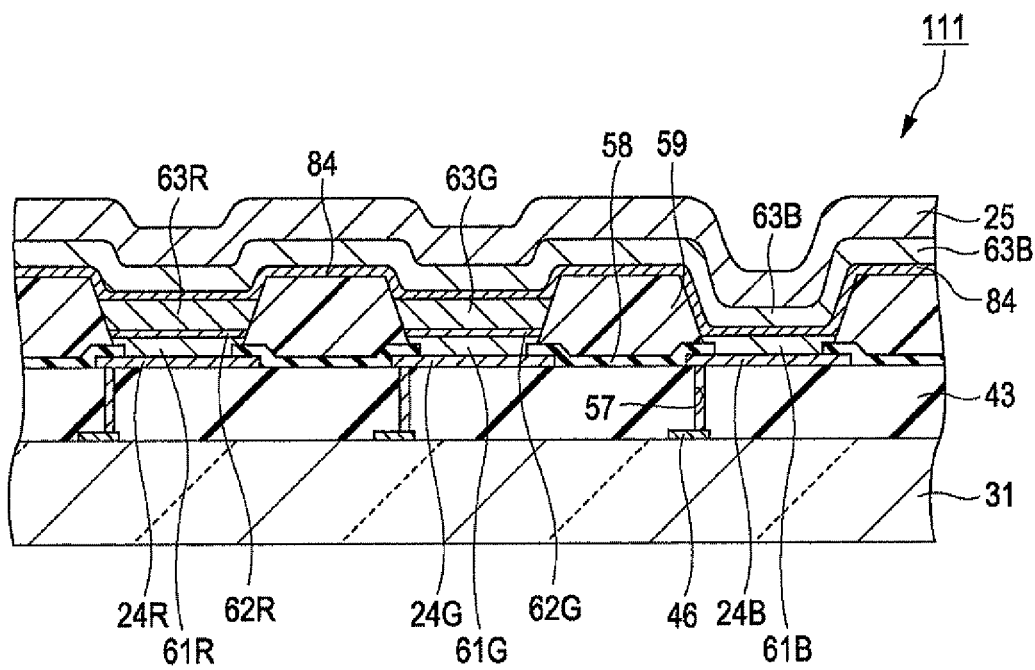
FIG. 25 is a schematic sectional view of a process step of the method for manufacturing the organic EL device, showing in sequential order.

FIGS. 23 to 25 are schematic sectional views of process steps of the method for manufacturing the organic EL device 111 according the fifth embodiment, showing in sequential order. The method for manufacturing the organic EL device 111 will now be described with reference to FIGS. 23 to 25. In the drawings for the following description, the same parts as in the fourth embodiment are designated by the same reference numerals, and descriptions of these parts will be omitted or simplified.

First, as shown in FIG. 23, the hole injection layers 61 are formed by, for example, an ink jet method on the respective anodes 24 surrounded by the partition member 59 in the light-emitting regions 66, 67 and 68.

Then, the hole transport layers 62 are formed on the respective hole injection layers 61 of the red and green light-emitting regions 66 and 67 by, for example, an ink jet method.

More specifically, in the red light-emitting region 66, the hole injection layer 61R and the hole transport layer 62R are formed in that order on the anode 24R. In the green light-emitting region 67, the hole injection layer 61G and the hole transport layer 62G are formed in that order on the anode 24G. In the blue light-emitting region 68, only the hole injection layer 61B is formed on the anode 24B.

Subsequently, the red luminescent layer 63R is formed on the hole transport layer 62R of the red light-emitting region 66 by, for example, an ink jet method. Also, the green luminescent layer 63G is formed on the hole transport layer 62G of the green light-emitting region 67 by, for example, an ink jet method.

Turning to FIG. 24, subsequently, the intermediate layer 84 is formed by vapor deposition over the entire surface of the element substrate 31 including the surfaces of the red and green luminescent layers 63R and 63G, the hole injection layer 61B of the blue light-emitting region 68, and the partition member 59.

Turning to FIG. 25, subsequently, the blue luminescent layer 63B and the cathode 25 are formed on the intermediate layer 84 by vapor deposition. More specifically, a multilayer structure is formed which includes an α-NPD layer having hole transport performance, a DPVBi blue luminescent layer, and an Alq3 layer having electron transport performance in that order from the intermediate layer 84 side. Subsequently, a lithium fluoride layer and an aluminum layer are formed, in that order from the blue luminescent layer 63B side, to form the cathode 25 on the luminescent layer 63B. Thus the organic EL device 91 is completed.

The fifth embodiment can produce the effects (1) to (5) of the above-described embodiments.

Structure of Electronic Apparatus

Figure 26:
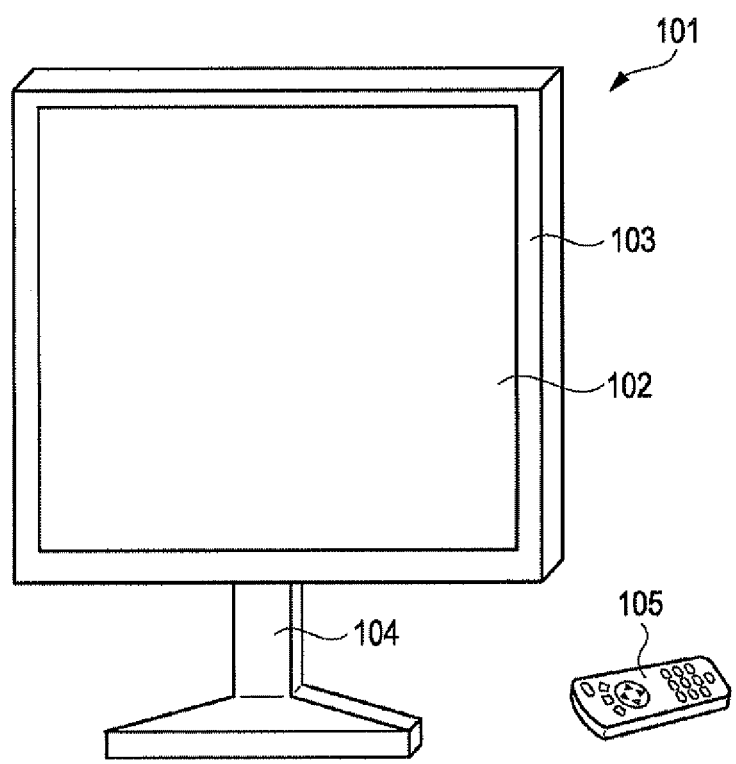
FIG. 26 is a schematic perspective view of a TV set being a type of electronic apparatus including an organic EL device.

FIG. 26 is a schematic perspective view of a TV set being a type of electronic apparatus including an organic EL device of an embodiment of the invention. The structure of the TV set will now be described with reference to FIG. 26.

As shown in FIG. 26, the TV set 101 includes a display portion 102, a frame 103, a leg 104, and a remote controller 105. The display portion 102 includes any one of the organic EL devices 11, 71, 81 and 91 produced by the method according to an embodiment of the present invention. The frame 103 supports the display portion 102. The leg 104 fixes the display portion 102 and the frame 103 at a predetermined height. The remote controller 105 is used, for example, for turning on or off the power of the TV set 101 and for changing channels.

The organic EL devices according to embodiments of the invention can be used for other electronic apparatuses, such as display panels, cellular phones, mobile computers, digital cameras, digital video cameras, car navigation systems, and audio equipment.

The fifth embodiment produces the following effect.

(6) The electronic apparatus including the organic EL device of an embodiment of the invention can form high-quality images.

The organic EL device and the electronic apparatus can be modified as below without being limited to the above-described embodiments.

First Modification

Figure 27:
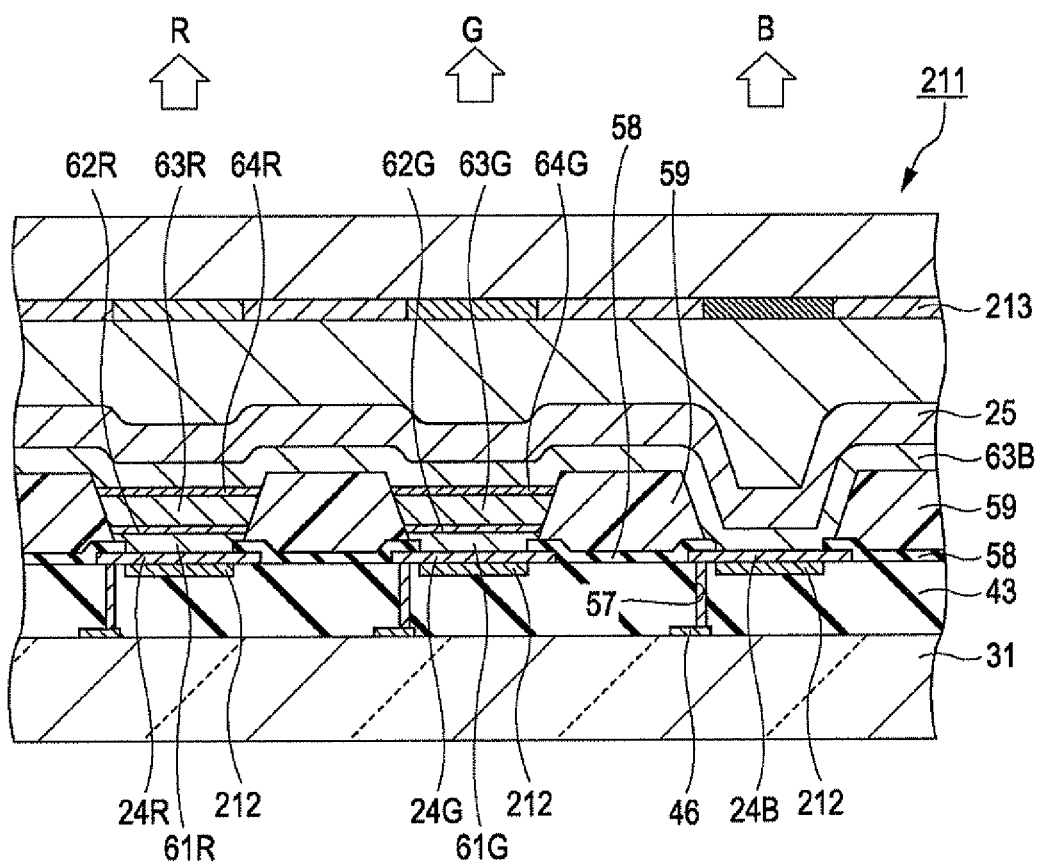
FIG. 27 is a schematic sectional view of an organic EL device according to a modification of the disclosed embodiments.

Although the organic EL devices of the above embodiments do not include color filters, color filters may be provided as shown in FIG. 27. FIG. 27 is a schematic sectional view of an organic EL device according to a modification of embodiments of the invention. In the organic EL device 211 shown in FIG. 27, color filters (color conversion layer) 213 are provided in, for example, the organic EL device 11 of the first embodiment. More specifically, the organic EL device 211 has a top emission structure in which light-shielding layers 212 are disposed under the respective anodes 24 (24R, 24G and 24B), and the cathode 25 is made of an optically transparent material.

Since the blue luminescent layers 63B of the organic EL devices of the above embodiments are formed over the entire surface of the structure, the emitted colors may mixed. However, by passing light through the color filters 213, a mixed color of the light can be converted into a color close to the color before color mixture. Hence, the mixed color can be removed. Although the organic EL device 211 of the first modification is of top emission type, it can be of bottom emission type by changing the arrangement of the color filters 213. The color filters 213 may be provided to other embodiments of the organic EL device without limiting to the first embodiment. The function of the color filters is not limited to converting colors, and the color filters may have a coloring function.

Second Modification

The blue luminescent layer 63B is not limited to the three-layer structure including an α-NPD layer having hole transport performance, a DPVBi blue luminescent layer, and an Alq3 layer having electron transport performance, and may further include a hole blocking layer of, for example, BAlq, between the DPVBi layer and the Alq3 layer. This structure allows holes to stay in the luminescent layer, depending on the materials of the luminescent layer 63B. Consequently, holes and electrons can be efficiently combined.

Third Modification

The intermediate layer 84 of the third embodiment or the fourth embodiment is not limited to a cesium carbonate single layer, and may have a multilayer structure including, for example, a cesium carbonate layer and a molybdenum oxide ($MoO_3$) layer. In this instance, the thicknesses of the cesium carbonate layer and the molybdenum oxide layer can be each 1 nm. This structure can enhance the hole injection performance particularly in the blue light-emitting region.

Fourth Modification

It is not limited to the structure in which two layers of the hole injection layer 61 and the hole transport layer 62 are disposed on the anode 24 as in the second embodiment or the fourth embodiment, and either layer may be provided depending, for example, on the performance of hole injection or hole transport to the luminescent layer.

Fifth Modification

The formation of the red luminescent layer 63R and the green luminescent layer 63G is not limited to coating of a polymer material, and a low-molecular-weight material may be applied for the red or green luminescent layer 63R or 63G.

Sixth Modification

The intermediate layer 84 is not limited to being formed over the entire surface of the element substrate 31 by vapor deposition as in the third embodiment or the fourth embodiment, and may be formed, for example, only in the display region. Alternatively, the intermediate layer may be formed only in the light-emitting regions by mask vapor deposition.

The entire disclosure of Japanese Patent Application No. 2009-252513, filed Nov. 3, 2009 and Japanese Patent Application No. 2010-121325, filed May 27, 2010 are expressly incorporated by reference herein.

What is claimed is:

1. A method for manufacturing an organic EL device, comprising:
    forming a first luminescent layer emitting first color light by coating over a first anode disposed on a substrate;
    forming a second luminescent layer emitting second color light by coating over a second anode disposed on the substrate;
    forming an intermediate layer having electron injection performance on the first luminescent layer and the second luminescent layer;
    forming a third luminescent layer emitting third color light by vapor deposition over the intermediate layer and a third anode disposed on the substrate;
    forming a cathode on the third luminescent layer; and
    forming at least one of a hole injection layer and a hole transport layer between the third anode and the third luminescent layer,
    wherein the intermediate layer is formed between the hole injection layer or the hole transport layer and the third luminescent layer.

2. The method according to claim 1, wherein the first luminescent layer is a red luminescent layer, the second luminescent layer is a green luminescent layer, and the third luminescent layer is a blue luminescent layer.

3. The method according to claim 1, wherein the third luminescent layer includes a layer having hole transport performance and a layer having electron transport performance.

4. The method according to claim 1, further comprising forming at least one of a hole injection layer and a hole transport layer between the first anode and the first luminescent layer and between the second anode and the second luminescent layer.

5. The method according to claim 1, wherein the intermediate layer is formed in a region including a portion between the third anode and the third luminescent layer.

6. The method according to claim 1, wherein the intermediate layer is formed by coating.

7. The method according to claim 6, wherein the coating is an ink jet method.

8. The method according to claim 1, wherein the intermediate layer is formed by vapor deposition.

9. The method according to claim 1, wherein the intermediate layer contains cesium carbonate.

10. The method according to claim 1, further comprising forming a color conversion layer.

11. An electronic apparatus comprising an organic EL device manufactured by the method as set forth in claim 1.

12. An organic EL device comprising:
a substrate;
a first luminescent layer emitting first color light, formed over a first anode disposed on the substrate by coating;
a second luminescent layer emitting second color light, formed over a second anode disposed on the substrate by coating; an intermediate layer having electron injection performance formed on the first luminescent layer and the second luminescent layer;
a third luminescent layer emitting third color light, formed by vapor deposition over the intermediate layer and a third anode disposed on the substrate;
a cathode disposed on the third luminescent layer; and at least one of a hole injection layer and a hole transport layer formed between the third anode and the third luminescent layer,
wherein the intermediate layer is formed between the hole injection layer or the hole transport layer and the third luminescent layer.

13. The organic EL device according to claim 12, wherein the first luminescent layer emits red light, the second luminescent layer emits green light, and the third luminescent layer emits blue light.

14. An electronic apparatus comprising an organic EL device as set forth in claim 13.

15. An electronic apparatus comprising an organic EL device as set forth in claim 12.

* * * * *